(12) United States Patent
Sieber et al.

(10) Patent No.: US 9,921,045 B2
(45) Date of Patent: Mar. 20, 2018

(54) SYSTEMS, METHODS, AND APPARATUS FOR INCREASED FOREIGN OBJECT DETECTION LOOP ARRAY SENSITIVITY

(71) Applicant: QUALCOMM Incorporated, San Diego, CA (US)

(72) Inventors: Lukas Sieber, Olten (CH); Marcel Fischer, Boniswil (CH); Hanspeter Widmer, Wohlenschwil (CH)

(73) Assignee: QUALCOMM Incorporated, San Diego, CA (US)

( * ) Notice: Subject to any disclaimer, the term of this patent is extended or adjusted under 35 U.S.C. 154(b) by 174 days.

(21) Appl. No.: 14/218,516

(22) Filed: Mar. 18, 2014

(65) Prior Publication Data

US 2015/0109000 A1    Apr. 23, 2015

Related U.S. Application Data

(60) Provisional application No. 61/894,313, filed on Oct. 22, 2013.

(51) Int. Cl.
*G01B 7/00* (2006.01)
*G01R 29/08* (2006.01)
(Continued)

(52) U.S. Cl.
CPC ............ *G01B 7/003* (2013.01); *B60L 11/182* (2013.01); *B60L 11/1829* (2013.01);
(Continued)

(58) Field of Classification Search
None
See application file for complete search history.

(56) References Cited

U.S. PATENT DOCUMENTS 3,018,395 A    1/1962  Carlstein
6,216,540 B1   4/2001  Nelson et al.
(Continued)

FOREIGN PATENT DOCUMENTS

CN    102694423 A    9/2012
CN    102804541 A    11/2012
(Continued)

OTHER PUBLICATIONS

International Search Report and Written Opinion—PCT/US2014/061190—ISA/EPO—Feb. 6, 2015.
(Continued)

*Primary Examiner* — Melissa Koval
*Assistant Examiner* — Felicia Farrow
(74) *Attorney, Agent, or Firm* — Knobbe, Martens, Olson & Bear, LLP

(57) ABSTRACT

An apparatus for detecting a presence of an object can include a plurality of electrically conductive loops arranged in an array. The apparatus includes a sensor circuit configured to determine a characteristic associated with each of the plurality of loops. The apparatus includes a hardware processor configured to, for each loop of the plurality of loops, determine a parameter based on the characteristic associated with the loop and the characteristic associated with at least one adjacent loop. The hardware processor may be further configured to determine the presence of the object based on the parameter. The parameter may comprise a sum of a difference between the characteristic associated with the loop and a reference value for the characteristic, and a difference between the characteristic associated with each of the at least one adjacent loop and the reference value.

26 Claims, 15 Drawing Sheets

(51) Int. Cl.
  *B60L 11/18* (2006.01)
  *H02J 7/02* (2016.01)
  *H02J 5/00* (2016.01)
(52) U.S. Cl.
  CPC .......... *G01R 29/0807* (2013.01); *H02J 5/005* (2013.01); *H02J 7/025* (2013.01)

(56) References Cited

U.S. PATENT DOCUMENTS

| | | | |
|---|---|---|---|
| 6,864,108 | B1 | 3/2005 | Papa Rao et al. |
| 7,705,589 | B2 | 4/2010 | Kim et al. |
| 7,994,778 | B2 | 8/2011 | Kirchdoerffer et al. |
| 8,193,806 | B2* | 6/2012 | Yamaguchi ........ G01R 33/0029 324/166 |
| 8,618,794 | B2 | 12/2013 | Ask et al. |
| 2009/0261778 | A1 | 10/2009 | Kook |
| 2010/0060270 | A1 | 3/2010 | Gong et al. |
| 2010/0134096 | A1 | 6/2010 | Chiba et al. |
| 2010/0259217 | A1 | 10/2010 | Baarman et al. |
| 2010/0277121 | A1 | 11/2010 | Hall et al. |
| 2011/0128015 | A1* | 6/2011 | Dorairaj ................. H02J 5/005 324/629 |
| 2011/0251809 | A1* | 10/2011 | Stollenwerk ............ B61L 1/187 324/656 |
| 2012/0112534 | A1 | 5/2012 | Kesler et al. |
| 2012/0112691 | A1 | 5/2012 | Kurs et al. |
| 2012/0146580 | A1 | 6/2012 | Kitamura |
| 2012/0175967 | A1 | 7/2012 | Dibben et al. |
| 2012/0176085 | A1 | 7/2012 | Iida et al. |
| 2012/0181875 | A1 | 7/2012 | Wechlin et al. |
| 2012/0206138 | A1 | 8/2012 | Derungs |
| 2013/0099592 | A1 | 4/2013 | Abe |
| 2013/0181724 | A1 | 7/2013 | Teggatz et al. |
| 2013/0193771 | A1 | 8/2013 | Teggatz |
| 2013/0249682 | A1 | 9/2013 | Van Wiemeersch et al. |
| 2013/0264887 | A1 | 10/2013 | Arisawa |
| 2014/0015329 | A1 | 1/2014 | Widmer et al. |
| 2014/0015522 | A1 | 1/2014 | Widmer et al. |
| 2014/0111019 | A1* | 4/2014 | Roy ....................... G01V 3/081 324/656 |
| 2014/0167704 | A1 | 6/2014 | Lafontaine et al. |
| 2015/0331135 | A1 | 11/2015 | Widmer |
| 2016/0172891 | A1 | 6/2016 | Filippenko et al. |
| 2016/0187519 | A1 | 6/2016 | Widmer et al. |
| 2016/0187520 | A1 | 6/2016 | Widmer et al. |

FOREIGN PATENT DOCUMENTS

| | | |
|---|---|---|
| CN | 103308949 A | 9/2013 |
| EP | 0782012 A2 | 7/1997 |
| EP | 2378316 A1 | 10/2011 |
| GB | 2025630 A | 1/1980 |
| JP | 2013208012 A | 10/2013 |
| WO | WO-2013127445 A1 | 9/2013 |
| WO | WO-2014095722 A2 | 6/2014 |

OTHER PUBLICATIONS

Serway et al., "Physics for Scientists and Engineers", vol. 2, chapters 23-46, Seventh Edition, Thompson Learning, Inc. 2008, p. 884.

Kesler., "Highly Resonant Wireless Power Transfer: Safe, Efficient, and over Distance", WiTricity Corporation, 2013, available online at http://www.witricity.com/assets/highly-resonant-power-transfer-kesler-witricity-2013.pdf; 32 pages.

* cited by examiner

SYSTEMS, METHODS, AND APPARATUS FOR INCREASED FOREIGN OBJECT DETECTION LOOP ARRAY SENSITIVITY

CLAIM OF PRIORITY UNDER 35 U.S.C. § 119

The present application for patent claims priority to Provisional Application No. 61/894,313 entitled "SYSTEMS, METHODS, AND APPARATUS FOR INCREASED FOREIGN OBJECT DETECTION LOOP ARRAY SENSITIVITY" filed Oct. 22, 2013, and assigned to the assignee hereof. Provisional Application No. 61/894,313 is hereby expressly incorporated by reference herein.

FIELD

The present disclosure relates generally to wireless power transfer, and more specifically to devices, systems, and methods for increased foreign object detection loop array sensitivity.

BACKGROUND

Remote systems, such as vehicles, have been introduced that include locomotion power derived from electricity received from an energy storage device such as a battery. For example, hybrid electric vehicles include on-board chargers that use power from vehicle braking and traditional motors to charge the vehicles. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless charging systems that are capable of transferring power in free space (e.g., via a wireless field) to be used to charge electric vehicles may overcome some of the deficiencies of wired charging solutions. However, the wireless fields may induce eddy currents in a well conducting (e.g., metallic) object located within the wireless field, potentially causing the object to heat up, vibrate or cause a nearby object to melt or catch fire. As such, wireless charging systems and methods that efficiently and safely transfer power for charging electric vehicles are desirable.

SUMMARY

Various embodiments of systems, methods and devices within the scope of the appended claims each have several aspects, no single one of which is solely responsible for the desirable attributes described herein. Without limiting the scope of the appended claims, some prominent features are described herein.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an apparatus for detecting a presence of an object. The apparatus comprises a plurality of electrically conductive loops arranged in an array. The apparatus further comprises a sensor circuit configured to determine a characteristic associated with each of the plurality of loops. The apparatus further comprises a hardware processor configured to, for each loop of the plurality of loops, determine a parameter based on the characteristic associated with the loop and the characteristic associated with at least one adjacent loop. The hardware processor is further configured to determine the presence of the object based on the parameter.

Another aspect of the disclosure provides an embodiment of a method for detecting a presence of an object. The method comprises determining a characteristic associated with each of a plurality of electrically conductive loops arranged in an array. The method further comprises for each loop of the plurality of loops, determining a parameter based on the characteristic associated with the loop and the characteristic associated with at least one adjacent loop. The method further comprises determining the presence of the object based on the parameter.

Yet another aspect of the disclosure provides an apparatus for detecting a presence of an object. The apparatus comprises means for determining a characteristic associated with each of a plurality of loops of a loop array. The apparatus further comprises means for, for each loop of the plurality of loops, determining a parameter based on the characteristic associated with the loop and the characteristic associated with at least one adjacent loop. The apparatus further comprises means for determining the presence of the object based on the parameter.

Another aspect of the disclosure provides a non-transitory computer-readable medium for detecting a presence of an object. The non-transitory computer-readable medium computer program has encoded thereon instructions that when executed cause an apparatus to determine a characteristic associated with each of a plurality of electrically conductive loops arranged in an array. The instructions, when executed, further cause the apparatus to, for each loop of the plurality of loops, determine a parameter based on the characteristic associated with the loop and the characteristic associated with at least one adjacent loop. The instructions, when executed, further cause the apparatus to determine the presence of the object based on the parameter.

Figure 1:
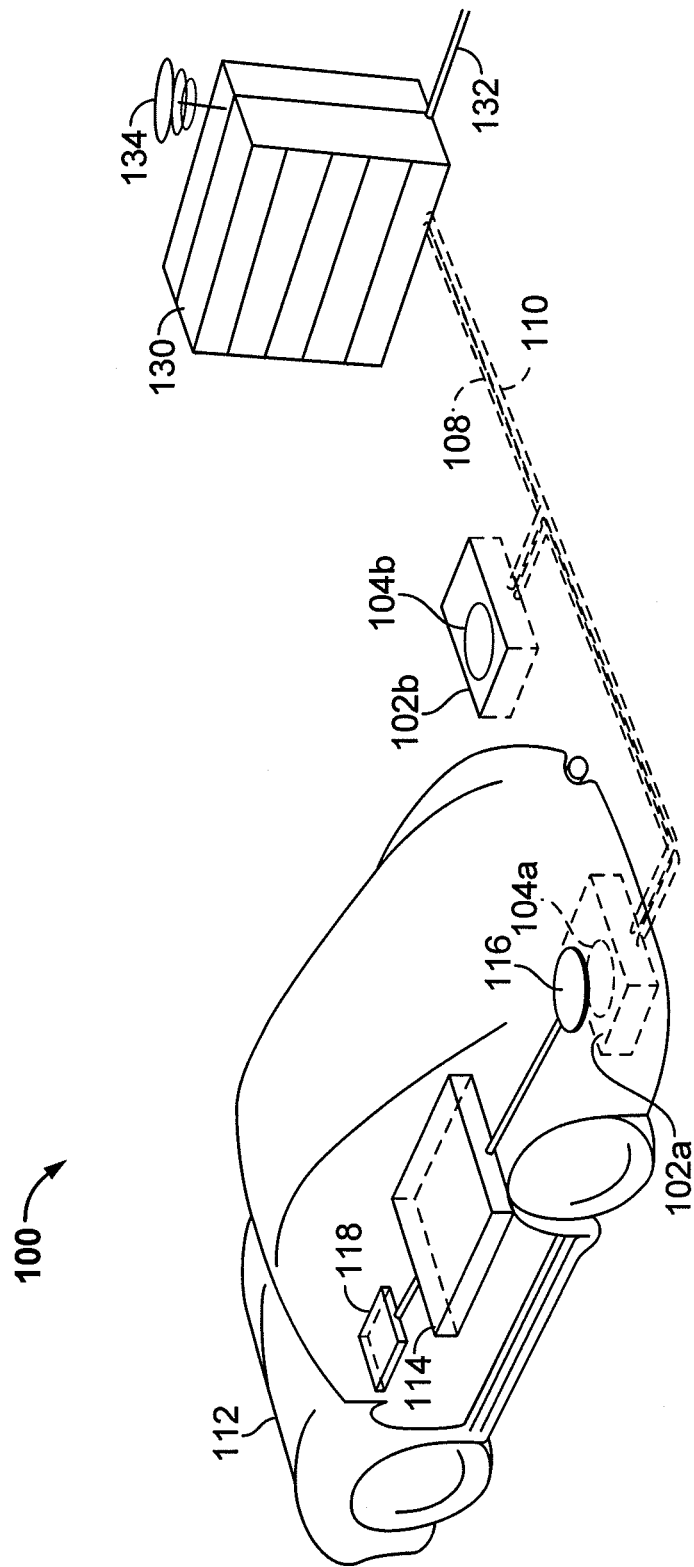
FIG. 1 is a diagram of an exemplary wireless power transfer system for charging an electric vehicle, in accordance with an exemplary embodiment.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as personal computing devices and the like).

FIG. 1 is a diagram of an exemplary wireless power transfer system 100 for charging an electric vehicle 112, in accordance with an exemplary embodiment. The wireless power transfer system 100 enables charging of an electric vehicle 112 while the electric vehicle 112 is parked near a base wireless charging system 102a. Spaces for two electric vehicles are illustrated in a parking area to be parked over corresponding base wireless charging system 102a and 102b. In some embodiments, a local distribution center 130 may be connected to a power backbone 132 and configured to provide an alternating current (AC) or a direct current (DC) supply through a power link 110 to the base wireless charging system 102a. The base wireless charging system 102a also includes a base system induction coil 104a for wirelessly transferring or receiving power. An electric vehicle 112 may include a battery unit 118, an electric vehicle induction coil 116, and an electric vehicle wireless charging system 114. The electric vehicle induction coil 116 may interact with the base system induction coil 104a for example, via a region of the electromagnetic field generated by the base system induction coil 104a.

In some exemplary embodiments, the electric vehicle induction coil 116 may receive power when the electric vehicle induction coil 116 is located in an energy field produced by the base system induction coil 104a. The field corresponds to a region where energy output by the base system induction coil 104a may be captured by an electric vehicle induction coil 116. For example, the energy output by the base system induction coil 104a may be at a level sufficient to charge or power the electric vehicle 112. In some cases, the field may correspond to the "near field" of the base system induction coil 104a. The near-field may correspond to a region in which there are strong reactive fields resulting from the currents and charges in the base system induction coil 104a that do not radiate power away from the base system induction coil 104a. In some cases the near-field may correspond to a region that is within about $\frac{1}{2}\pi$ of wavelength of the base system induction coil 104a (and vice versa for the electric vehicle induction coil 116) as will be further described below.

Local distribution 130 may be configured to communicate with external sources (e.g., a power grid) via a communication backhaul 134, and with the base wireless charging system 102*a* via a communication link 108.

In some embodiments the electric vehicle induction coil 116 may be aligned with the base system induction coil 104*a* and, therefore, disposed within a near-field region simply by the driver positioning the electric vehicle 112 correctly relative to the base system induction coil 104*a*. In other embodiments, the driver may be given visual feedback, auditory feedback, or combinations thereof to determine when the electric vehicle 112 is properly placed for wireless power transfer. In yet other embodiments, the electric vehicle 112 may be positioned by an autopilot system, which may move the electric vehicle 112 back and forth (e.g., in zig-zag movements) until an alignment error has reached a tolerable value. This may be performed automatically and autonomously by the electric vehicle 112 without or with only minimal driver intervention provided that the electric vehicle 112 is equipped with a servo steering wheel, ultrasonic sensors, and intelligence to adjust the vehicle. In still other embodiments, the electric vehicle induction coil 116, the base system induction coil 104*a*, or a combination thereof may have functionality for displacing and moving the induction coils 116 and 104*a* relative to each other to more accurately orient them and develop more efficient coupling therebetween.

The base wireless charging system 102*a* may be located in a variety of locations. As non-limiting examples, some suitable locations include a parking area at a home of the electric vehicle 112 owner, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention and manipulations thereby improving convenience to a user. There may also be no exposed electrical contacts and no mechanical wear out, thereby improving reliability of the wireless power transfer system 100. Manipulations with cables and connectors may not be needed, and there may be no cables, plugs, or sockets that may be exposed to moisture and water in an outdoor environment, thereby improving safety. There may also be no sockets, cables, and plugs visible or accessible, thereby reducing potential vandalism of power charging devices. Further, since an electric vehicle 112 may be used as distributed storage devices to stabilize a power grid, a docking-to-grid solution may be used to increase availability of vehicles for Vehicle-to-Grid (V2G) operation.

A wireless power transfer system 100 as described with reference to FIG. 1 may also provide aesthetical and non-impedimental advantages. For example, there may be no charge columns and cables that may be impedimental for vehicles and/or pedestrians.

As a further explanation of the vehicle-to-grid capability, the wireless power transmit and receive capabilities may be configured to be reciprocal such that the base wireless charging system 102*a* transfers power to the electric vehicle 112 and the electric vehicle 112 transfers power to the base wireless charging system 102*a*, e.g., in times of energy shortfall. This capability may be useful to stabilize the power distribution grid by allowing electric vehicles to contribute power to the overall distribution system in times of energy shortfall caused by over demand or shortfall in renewable energy production (e.g., wind or solar).

Figure 2:
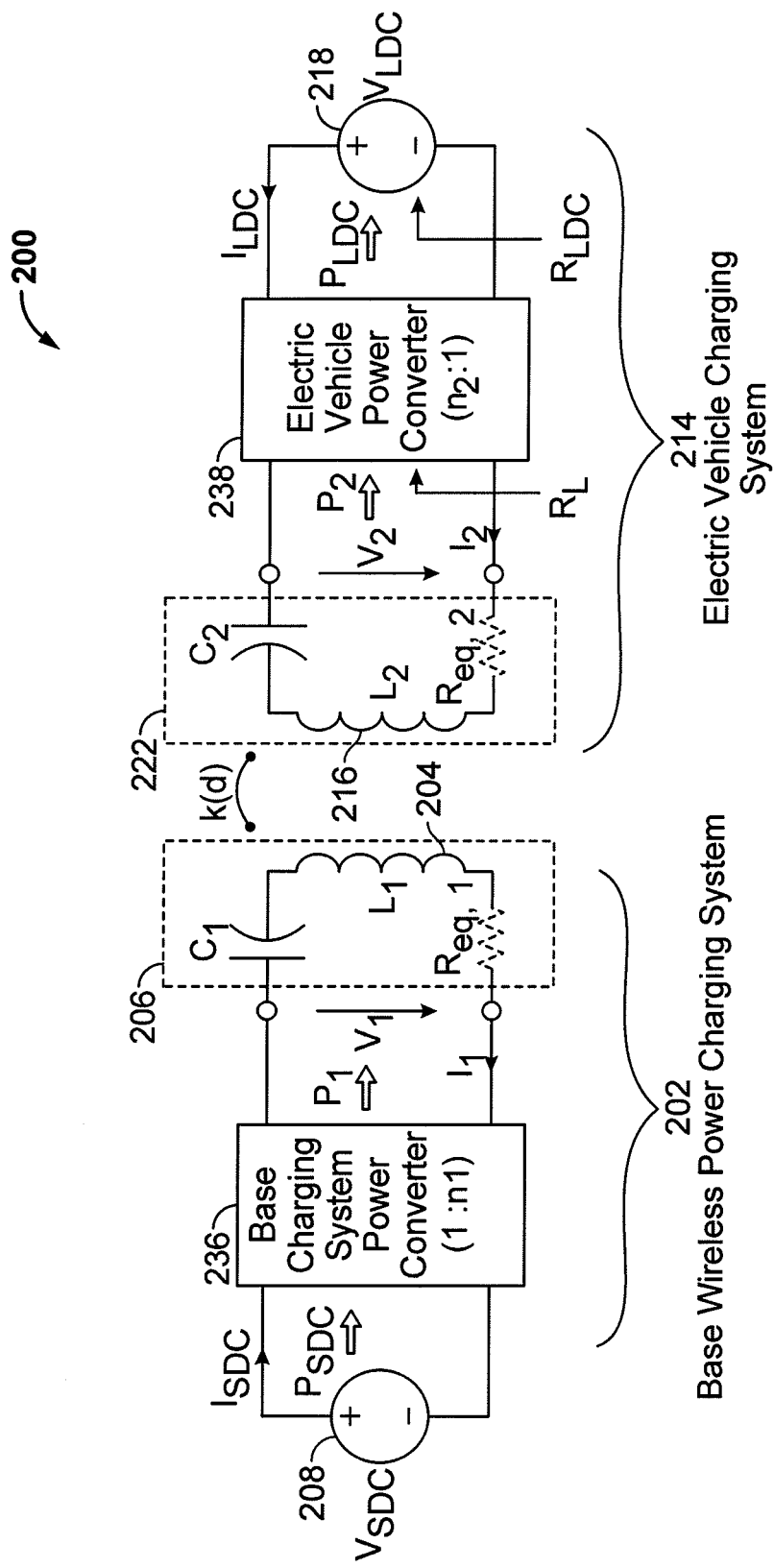
FIG. 2 is a schematic diagram of exemplary core components of the wireless power transfer system of FIG. 1.

FIG. 2 is a schematic diagram of exemplary core components of the wireless power transfer system 100 of FIG. 1. As shown in FIG. 2, the wireless power transfer system 200 may include a base system transmit circuit 206 including a base system induction coil 204 having an inductance $L_1$. The wireless power transfer system 200 further includes an electric vehicle receive circuit 222 including an electric vehicle induction coil 216 having an inductance $L_2$. Embodiments described herein may use capacitively loaded wire loops (i.e., multi-turn coils) forming a resonant structure that is capable of efficiently coupling energy from a primary structure (transmitter) to a secondary structure (receiver) via a magnetic or electromagnetic near field if both primary and secondary are tuned to a common resonant frequency. The coils may be used for the electric vehicle induction coil 216 and the base system induction coil 204. Using resonant structures for coupling energy may be referred to "magnetic coupled resonance," "electromagnetic coupled resonance," and/or "resonant induction." The operation of the wireless power transfer system 200 will be described based on power transfer from a base wireless power charging system 202 to an electric vehicle 112, but is not limited thereto. For example, as discussed above, the electric vehicle 112 may transfer power to the base wireless charging system 102*a*.

With reference to FIG. 2, a power supply 208 (e.g., AC or DC) supplies power $P_{SDC}$ to the base wireless power charging system 202 to transfer energy to an electric vehicle 112. The base wireless power charging system 202 includes a base charging system power converter 236. The base charging system power converter 236 may include circuitry such as an AC/DC converter configured to convert power from standard mains AC to DC power at a suitable voltage level, and a DC/low frequency (LF) converter configured to convert DC power to power at an operating frequency suitable for wireless high power transfer. The base charging system power converter 236 supplies power $P_1$ to the base system transmit circuit 206 including the capacitor $C_1$ in series with the base system induction coil 204 to emit an electromagnetic field at a desired frequency. The capacitor $C_1$ may be coupled with the base system induction coil 204 either in parallel or in series, or may be formed of several reactive elements in any combination of parallel or series topology. The capacitor $C_1$ may be provided to form a resonant circuit with the base system induction coil 204 that resonates at a desired frequency. The base system induction coil 204 receives the power $P_1$ and wirelessly transmits power at a level sufficient to charge or power the electric vehicle 112. For example, the power level provided wirelessly by the base system induction coil 204 may be on the order of kilowatts (kW) (e.g., anywhere from 1 kW to 110 kW or higher or lower).

The base system transmit circuit 206 including the base system induction coil 204 and electric vehicle receive circuit 222 including the electric vehicle induction coil 216 may be tuned to substantially the same frequencies and may be positioned within the near-field of an electromagnetic field transmitted by one of the base system induction coil 204 and the electric vehicle induction coil 116. In this case, the base system induction coil 204 and electric vehicle induction coil 116 may become coupled to one another such that power may be transferred to the electric vehicle receive circuit 222 including capacitor $C_2$ and electric vehicle induction coil 116. The capacitor $C_2$ may be provided to form a resonant circuit with the electric vehicle induction coil 216 that resonates at a desired frequency. The capacitor $C_2$ may be coupled with the electric vehicle induction coil 204 either in parallel or in series, or may be formed of several reactive elements in any combination of parallel or series topology. Element k(d) represents the mutual coupling coefficient resulting at coil separation. Equivalent resistances $R_{eq,1}$ and $R_{eq,2}$ represent the losses that may be inherent to the induction coils 204 and 216 and the anti-reactance capacitors $C_1$ and $C_2$. The electric vehicle receive circuit 222 including the electric vehicle induction coil 316 and capacitor $C_2$ receives power $P_2$ and provides the power $P_2$ to an electric vehicle power converter 238 of an electric vehicle charging system 214.

The electric vehicle power converter 238 may include, among other things, a LF/DC converter configured to convert power at an operating frequency back to DC power at a voltage level matched to the voltage level of an electric vehicle battery unit 218. The electric vehicle power converter 238 may provide the converted power $P_{LDC}$ to charge the electric vehicle battery unit 218. The power supply 208, base charging system power converter 236, and base system induction coil 204 may be stationary and located at a variety of locations as discussed above. The battery unit 218, electric vehicle power converter 238, and electric vehicle induction coil 216 may be included in an electric vehicle charging system 214 that is part of electric vehicle 112 or part of the battery pack (not shown). The electric vehicle charging system 214 may also be configured to provide power wirelessly through the electric vehicle induction coil 216 to the base wireless power charging system 202 to feed power back to the grid. Each of the electric vehicle induction coil 216 and the base system induction coil 204 may act as transmit or receive induction coils based on the mode of operation.

While not shown, the wireless power transfer system 200 may include a load disconnect unit (LDU) to safely disconnect the electric vehicle battery unit 218 or the power supply 208 from the wireless power transfer system 200. For example, in case of an emergency or system failure, the LDU may be triggered to disconnect the load from the wireless power transfer system 200. The LDU may be provided in addition to a battery management system for managing charging to a battery, or it may be part of the battery management system.

Further, the electric vehicle charging system 214 may include switching circuitry (not shown) for selectively connecting and disconnecting the electric vehicle induction coil 216 to the electric vehicle power converter 238. Disconnecting the electric vehicle induction coil 216 may suspend charging and also may adjust the "load" as "seen" by the base wireless charging system 102a (acting as a transmitter), which may be used to "cloak" the electric vehicle charging system 114 (acting as the receiver) from the base wireless charging system 102a. The load changes may be detected if the transmitter includes the load sensing circuit. Accordingly, the transmitter, such as a base wireless charging system 202, may have a mechanism for determining when receivers, such as an electric vehicle charging system 114, are present in the near-field of the base system induction coil 204.

As described above, in operation, assuming energy transfer towards the vehicle or battery, input power is provided from the power supply 208 such that the base system induction coil 204 generates a field for providing the energy transfer. The electric vehicle induction coil 216 couples to the radiated field and generates output power for storage or consumption by the electric vehicle 112. As described above, in some embodiments, the base system induction coil 204 and electric vehicle induction coil 116 are configured according to a mutual resonant relationship such that when the resonant frequency of the electric vehicle induction coil 116 and the resonant frequency of the base system induction coil 204 are very close or substantially the same. Transmission losses between the base wireless power charging system 202 and electric vehicle charging system 214 are minimal when the electric vehicle induction coil 216 is located in the near-field of the base system induction coil 204.

As stated, an efficient energy transfer occurs by coupling a large portion of the energy in the near field of a transmitting induction coil to a receiving induction coil rather than propagating most of the energy in an electromagnetic wave to the far-field. When in the near field, a coupling mode may be established between the transmit induction coil and the receive induction coil. The area around the induction coils where this near field coupling may occur is referred to herein as a near field coupling mode region.

While not shown, the base charging system power converter 236 and the electric vehicle power converter 238 may both include an oscillator, a driver circuit such as a power amplifier, a filter, and a matching circuit for efficient coupling with the wireless power induction coil. The oscillator may be configured to generate a desired frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance of the power conversion module to the wireless power induction coil. The power converters 236 and 238 may also include a rectifier and switching circuitry to generate a suitable power output to charge the battery.

The electric vehicle induction coil 216 and base system induction coil 204 as described throughout the disclosed embodiments may be referred to or configured as "loop" antennas, and more specifically, multi-turn loop antennas. The induction coils 204 and 216 may also be referred to herein or be configured as "magnetic" antennas. The term "coils" is intended to refer to a component that may wirelessly output or receive energy four coupling to another "coil." The coil may also be referred to as an "antenna" of a type that is configured to wirelessly output or receive power. As used herein, coils 204 and 216 are examples of "power transfer components" of a type that are configured to wirelessly output, wirelessly receive, and/or wirelessly relay power. Loop (e.g., multi-turn loop) antennas may be configured to include an air core or a physical core such as a ferrite core. An air core loop antenna may allow the placement of other components within the core area. Physical core antennas including ferromagnetic or ferromagnetic materials may allow development of a stronger electromagnetic field and improved coupling.

As discussed above, efficient transfer of energy between a transmitter and receiver occurs during matched or nearly matched resonance between a transmitter and a receiver. However, even when resonance between a transmitter and receiver are not matched, energy may be transferred at a lower efficiency. Transfer of energy occurs by coupling energy from the near field of the transmitting induction coil to the receiving induction coil residing within a region (e.g., within a predetermined frequency range of the resonant frequency, or within a predetermined distance of the near-field region) where this near field is established rather than propagating the energy from the transmitting induction coil into free space.

A resonant frequency may be based on the inductance and capacitance of a transmit circuit including an induction coil (e.g., the base system induction coil 204) as described above. As shown in FIG. 2, inductance may generally be the inductance of the induction coil, whereas, capacitance may be added to the induction coil to create a resonant structure at a desired resonant frequency. As a non-limiting example, as shown in FIG. 2, a capacitor may be added in series with the induction coil to create a resonant circuit (e.g., the base system transmit circuit 206) that generates an electromagnetic field. Accordingly, for larger diameter induction coils, the value of capacitance needed to induce resonance may decrease as the diameter or inductance of the coil increases. Inductance may also depend on a number of turns of an induction coil. Furthermore, as the diameter of the induction coil increases, the efficient energy transfer area of the near field may increase. Other resonant circuits are possible. As another non limiting example, a capacitor may be placed in parallel between the two terminals of the induction coil (e.g., a parallel resonant circuit). Furthermore an induction coil may be designed to have a high quality (Q) factor to improve the resonance of the induction coil. For example, the Q factor may be 300 or greater.

As described above, according to some embodiments, coupling power between two induction coils that are in the near field of one another is disclosed. As described above, the near field may correspond to a region around the induction coil in which electromagnetic fields exist but may not propagate or radiate away from the induction coil. Near-field coupling-mode regions may correspond to a volume that is near the physical volume of the induction coil, typically within a small fraction of the wavelength. According to some embodiments, electromagnetic induction coils, such as single and multi-turn loop antennas, are used for both transmitting and receiving since magnetic near field amplitudes in practical embodiments tend to be higher for magnetic type coils in comparison to the electric near fields of an electric type antenna (e.g., a small dipole). This allows for potentially higher coupling between the pair. Furthermore, "electric" antennas (e.g., dipoles and monopoles) or a combination of magnetic and electric antennas may be used.

Figure 3:
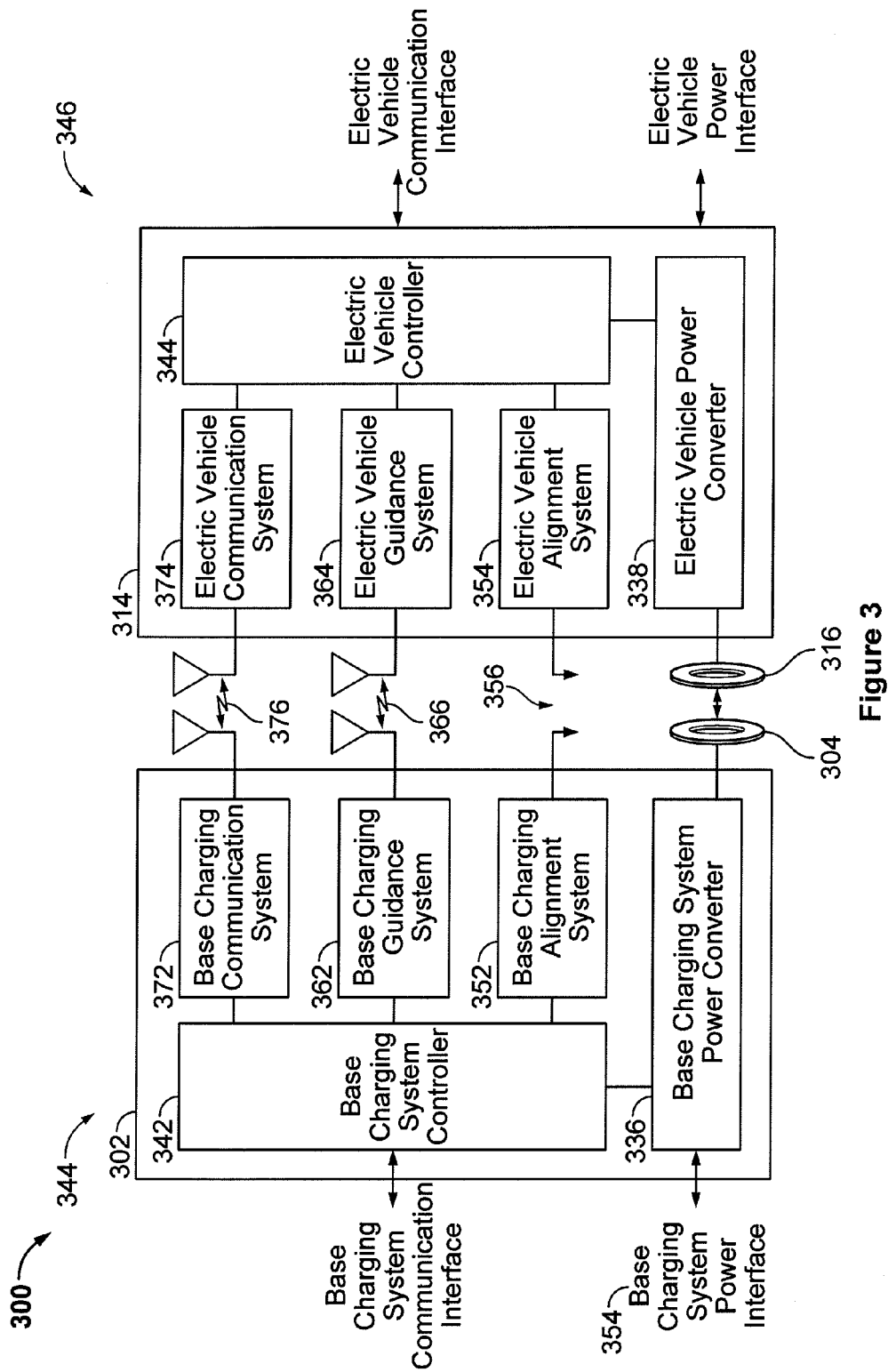
FIG. 3 is another functional block diagram showing exemplary core and ancillary components of the wireless power transfer system of FIG. 1.

FIG. 3 is another functional block diagram showing exemplary core and ancillary components of the wireless power transfer system 300 of FIG. 1. The wireless power transfer system 300 illustrates a communication link 376, a guidance link 366, and alignment systems 352, 354 for the base system induction coil 304 and electric vehicle induction coil 316. As described above with reference to FIG. 2, and assuming energy flow towards the electric vehicle 112, in FIG. 3 a base charging system power interface 354 may be configured to provide power to a charging system power converter 336 from a power source, such as an AC or DC power supply 126. The base charging system power converter 336 may receive AC or DC power from the base charging system power interface 354 to excite the base system induction coil 304 at or near its resonant frequency. The electric vehicle induction coil 316, when in the near field coupling-mode region, may receive energy from the near field coupling mode region to oscillate at or near the resonant frequency. The electric vehicle power converter 338 converts the oscillating signal from the electric vehicle induction coil 316 to a power signal suitable for charging a battery via the electric vehicle power interface.

The base wireless charging system 302 includes a base charging system controller 342 and the electric vehicle charging system 314 includes an electric vehicle controller 344. The base charging system controller 342 may include a base charging system communication interface 162 to other systems (not shown) such as, for example, a computer, and a power distribution center, or a smart power grid. The electric vehicle controller 344 may include an electric vehicle communication interface to other systems (not shown) such as, for example, an on-board computer on the vehicle, other battery charging controller, other electronic systems within the vehicles, and remote electronic systems.

The base charging system controller 342 and electric vehicle controller 344 may include subsystems or modules for specific application with separate communication channels. These communications channels may be separate physical channels or separate logical channels. As non-limiting examples, a base charging alignment system 352 may communicate with an electric vehicle alignment system 354 through a communication link 376 to provide a feedback mechanism for more closely aligning the base system induction coil 304 and electric vehicle induction coil 316, either autonomously or with operator assistance. Similarly, a base charging guidance system 362 may communicate with an electric vehicle guidance system 364 through a guidance link to provide a feedback mechanism to guide an operator in aligning the base system induction coil 304 and electric vehicle induction coil 316. In addition, there may be separate general-purpose communication links (e.g., channels) supported by base charging communication system 372 and electric vehicle communication system 374 for communicating other information between the base wireless power charging system 302 and the electric vehicle charging system 314. This information may include information about electric vehicle characteristics, battery characteristics, charging status, and power capabilities of both the base wireless power charging system 302 and the electric vehicle charging system 314, as well as maintenance and diagnostic data for the electric vehicle 112. These communication channels may be separate physical communication channels such as, for example, Bluetooth, zigbee, cellular, etc.

Electric vehicle controller 344 may also include a battery management system (BMS) (not shown) that manages charge and discharge of the electric vehicle principal battery, a parking assistance system based on microwave or ultrasonic radar principles, a brake system configured to perform a semi-automatic parking operation, and a steering wheel servo system configured to assist with a largely automated parking 'park by wire' that may provide higher parking accuracy, thus reducing the need for mechanical horizontal induction coil alignment in any of the base wireless charging system 102a and the electric vehicle charging system 114. Further, electric vehicle controller 344 may be configured to communicate with electronics of the electric vehicle 112. For example, electric vehicle controller 344 may be configured to communicate with visual output devices (e.g., a dashboard display), acoustic/audio output devices (e.g., buzzer, speakers), mechanical input devices (e.g., keyboard, touch screen, and pointing devices such as joystick, trackball, etc.), and audio input devices (e.g., microphone with electronic voice recognition).

Furthermore, the wireless power transfer system 300 may include detection and sensor systems. For example, the wireless power transfer system 300 may include sensors for use with systems to properly guide the driver or the vehicle to the charging spot, sensors to mutually align the induction coils with the required separation/coupling, sensors to detect objects that may obstruct the electric vehicle induction coil 316 from moving to a particular height and/or position to achieve coupling, and safety sensors for use with systems to perform a reliable, damage free, and safe operation of the system. For example, a safety sensor may include a sensor for detection of presence of animals or children approaching the wireless power induction coils 104*a*, 116 beyond a safety radius, detection of metal objects near the base system induction coil 304 that may be heated up (induction heating), detection of hazardous events such as incandescent objects on the base system induction coil 304, and temperature monitoring of the base wireless power charging system 302 and electric vehicle charging system 314 components.

The wireless power transfer system 300 may also support plug-in charging via a wired connection. A wired charge port may integrate the outputs of the two different chargers prior to transferring power to or from the electric vehicle 112. Switching circuits may provide the functionality as needed to support both wireless charging and charging via a wired charge port.

To communicate between a base wireless charging system 302 and an electric vehicle charging system 314, the wireless power transfer system 300 may use both in-band signaling and an RF data modem (e.g., Ethernet over radio in an unlicensed band). The out-of-band communication may provide sufficient bandwidth for the allocation of value-add services to the vehicle user/owner. A low depth amplitude or phase modulation of the wireless power carrier may serve as an in-band signaling system with minimal interference.

In addition, some communication may be performed via the wireless power link without using specific communications antennas. For example, the wireless power induction coils 304 and 316 may also be configured to act as wireless communication transmitters. Thus, some embodiments of the base wireless power charging system 302 may include a controller (not shown) for enabling keying type protocol on the wireless power path. By keying the transmit power level (amplitude shift keying) at predefined intervals with a predefined protocol, the receiver may detect a serial communication from the transmitter. The base charging system power converter 336 may include a load sensing circuit (not shown) for detecting the presence or absence of active electric vehicle receivers in the vicinity of the near field generated by the base system induction coil 304. By way of example, a load sensing circuit monitors the current flowing to the power amplifier, which is affected by the presence or absence of active receivers in the vicinity of the near field generated by base system induction coil 104*a*. Detection of changes to the loading on the power amplifier may be monitored by the base charging system controller 342 for use in determining whether to enable the oscillator for transmitting energy, to communicate with an active receiver, or a combination thereof.

To enable wireless high power transfer, some embodiments may be configured to transfer power at a frequency in the range from 10-60 kHz. This low frequency coupling may allow highly efficient power conversion that may be achieved using solid state devices. In addition, there may be less coexistence issues with radio systems compared to other bands.

With respect to induction charging, depending on the energy transfer rate (power level), operating frequency, size and design of the primary and secondary magnetic structures and the distance between them, the flux density in the air gap at some locations may exceed 0.5 mT and may reach several Millitesla. If an object that includes a certain amount of well conductive material (e.g., metal) is inserted into the space between the primary and secondary structures, eddy currents are generated in this object (Lenz's law), that may lead to power dissipation and subsequent heating effects. This induction heating effect depends on the magnetic flux density, the frequency of the alternating magnetic field, the size, shape, orientation and conductivity of the object's conducting structure. When the object is exposed to the magnetic field for a sufficiently long time, it may heat up to temperatures that may be considered hazardous in several regards. One hazard may be self-ignition if the object includes inflammable materials or if it is in direct contact with such materials, e.g., a cigarette package including a thin metalized foil. Another hazard may be burning the hand of a person that may pick-up such a hot object, e.g., a coin or a key. Another hazard may be damaging the plastic enclosure of the primary or secondary structure, e.g., an object melting into the plastic.

A temperature increase may be also expected in objects including ferromagnetic materials that may be substantially non-conducting but exhibiting a pronounced hysteresis effect or in materials that generate both hysteresis and eddy current losses. As such, detecting such objects is beneficial to avoid corresponding harmful consequences. If the object detection system is integrated within a system for providing wireless power, in response to detecting a harmful object, the system may reduce a power level or shut down until measures may be taken to remove the harmful object.

In certain applications of inductive power transfer such as charging of electric vehicles in domestic and public zones, it may be compulsory for reasons of safety of persons and equipment to be able to detect foreign objects that have the potential to heat up to critical temperatures. This may be particularly true in systems where the critical space is open and accessible such that foreign objects may get accidentally or may be put intentionally into this space (e.g., in case of sabotage).

Embodiments described herein are directed to automatically detecting hazardous foreign objects (e.g., 'metal objects') that may be located in a pre-defined space. In particular, certain embodiments are directed to detecting small metal objects (e.g., a coin) located adjacent to a surface of the primary or secondary magnetic structure where magnetic flux density may exceed a particular value (e.g., 0.5 mT).

In accordance with certain embodiments, inductive sensing based on magnetic fields may be preferably used since objects that can be sensed via the magnetic field may be objects that are potentially hazardous. Magnetic field sensing may be highly selective on electrically conductive and ferromagnetic objects. At frequencies, e.g., below 20 MHz where a magnetic field may be considered quasi-stationary, there may be virtually no interaction with non-conductive dielectric objects and almost no interaction with badly conducting materials such as water with high salinity, or water-drenched paper, wet wood and foliage, etc.

Figure 4:
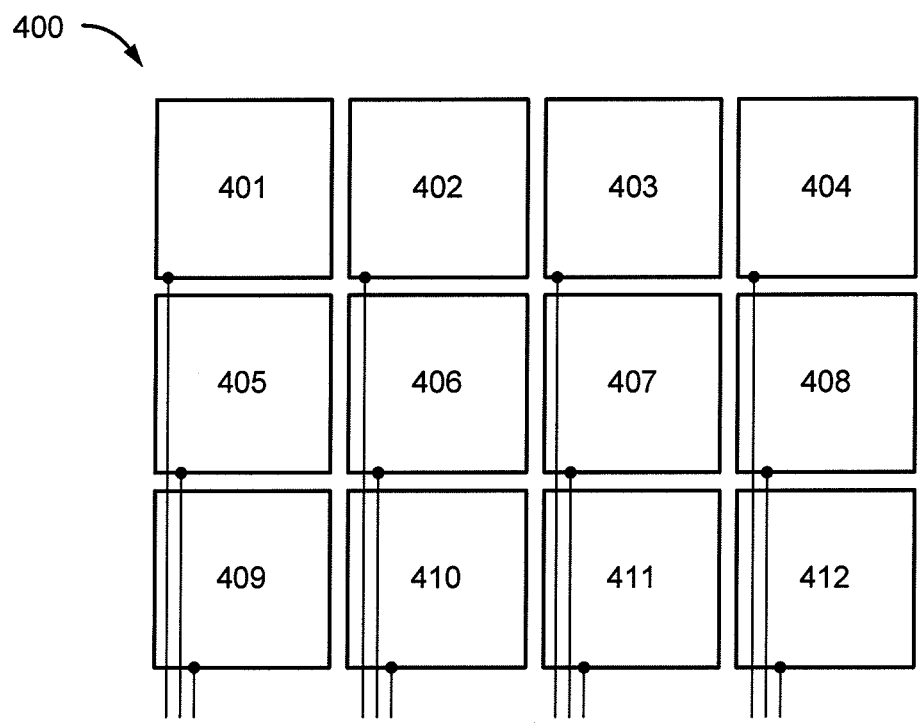
FIG. 4 is a diagram showing an exemplary loop array for object detection, in accordance with an exemplary embodiment.

FIG. 4 is a diagram showing an exemplary loop array for object detection, in accordance with an exemplary embodiment. FIG. 4 may include loop array 400 which may include a plurality of sense loops 401-412. Although 12 sense loops are show in FIG. 4, the present application is not so limited and may include any number of sense loops arranged in an array of any number of rows and columns, according to a particular application. The loops 401-412 may have a dimension of approximately 30 mm, although this dimension is not limiting and the loops 401-412 may be of any suitable dimension according to the particular application. In one embodiment, the sense loops 401-412 may not overlap one another. It should be understood that when the sense loops 401-412 do not overlap, any area encompassed by any one of the sense loops 401-412 will not also be encompassed by any other sense loop of the sense loops 401-412. Such a non-overlapping structure may be advantageous for several reasons. A PCB containing the loop array may be simpler and have a lower cost due to the fact that fewer layers may be required to implement a non-overlapping sense loop design. In addition, since the loops do not overlap one another the loops may be smaller than in embodiments where the loops overlap. These smaller loops may offer increased sensitivity to objects smaller than the loop size. Furthermore, a non-overlapping sense loop design may offer greater flexibility for different board arrangements because the PCB may be divided into several subsections and arranged in accordance with a particular application. However, the present application is not limited to non-overlapping sense loops. Thus in another embodiment, the sense loops 401-412 may overlap one another in at least one dimension.

The shape of each of the sense loops, for example sense loops 401-412 of loop array 400 shown in FIG. 4, may have a square or rectangular shape. In some embodiments, instead of using a square or a rectangular shape, loops 401-412 may be circular-, hexagonal-, or triangular-shaped. For example, densely packed hexagonal loops may provide improved sensitivity with a non-overlapping structure requiring a lower number of copper layers when implemented in a printed circuit board.

The sense loop array 400 may be located on or over a base wireless charging system, such as base wireless charging system 102a and/or 102b of FIG. 1 and may be utilized to detect the presence of one or more foreign objects on or over the base wireless charging system 102a and/or 102b. The sense loop array 400 may be configured to sense a change in impedance and/or resonance frequency of a sense loop as well as one or more adjacent sense loops due to the presence of the one or more foreign objects.

Each of loops 401-412 in the sense loop array 400 may be electrically connected to a detection circuit by a lead line. Although such lead lines are shown in FIG. 4 as a single line, the lead lines may include two lines, as shown in more detail in FIGS. 7 and 8 below. Because temperature variations in the sense loop array 400 may have a non-negligible effect on the impedance of the lead lines, as well as the sense loops themselves, it is desirable that lead lines for loops in the sense loop array 400 run parallel to one another, and that lead lines for loops in the same column, row, diagonal or particular adjacent grouping of the sense loop array 400 be run along substantially the same routing path. For example, the lead lines for each of loops 401, 405 and 409 may be routed together and parallel to one another. Similarly, the lead lines for each of loops 402, 406 and 410 may be routed together and parallel to one another. Although lead lines are shown being grouped and routed together by columns in the sense loop array 400, the lead lines may alternatively be grouped and routed together by row, diagonal, or any other suitable grouping of adjacent sense loops. Because the lead lines to particular adjacent loops are grouped and routed together, temperature increases in specific areas will influence the grouped lead lines substantially identically. Thus, any drift in measured impedance and/or resonance frequency due to temperature variations in the lead lines will be substantially identical for all sense loops having lead lines grouped and routed together. In such a case, the difference between the drift in impedance and/or resonance frequency for adjacent loops will remain constant even though the absolute response of individual loops drifts with temperature. This important concept may be utilized to compensate for drift due to temperature variations, as will be described in more detail in connection with FIGS. 16-21 below.

Figure 5:
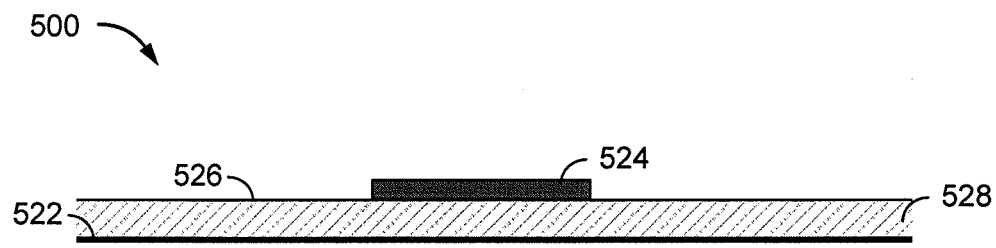
FIG. 5 is a side view of an exemplary loop array for object detection embedded within a base pad, in accordance with an embodiment.

FIG. 5 is a side view of an exemplary loop array for object detection embedded within a base pad, in accordance with an embodiment. The pad 500 may have a plastic enclosure 528 and may be configured to hold a planar, or non-overlapping sense loop array 522 and detect an object 524 placed anywhere on the surface 526 of the pad 500. The object 524 may be a well conducting (metallic and/or ferromagnetic) object. The charging pad 500 may further include a base system induction coil 104a (FIG. 1) and associated circuitry as described above with reference to FIGS. 1-3 and may be configured to detect an object on the pad 500.

The innate sensitivity of a sensor may be defined as the percentage change of a measured quantity (e.g., loop impedance, loop resonance frequency) as caused by the presence of the smallest object (reference object) if placed at a worst case position. The overall sensitivity of a foreign object detector depends on the innate sensitivity of the sensor and on the performance of additional post processing methods that may be part of the evaluation unit. For objects smaller than the loop size, the innate sensitivity increases with decreasing loop size. Decreasing loop size implies increasing the number of loops required to cover a given area resulting in increased complexity and costs and higher probability of false alarm and failure. In accordance with certain embodiments, an adequate trade-off between innate sensitivity and circuit complexity may be achieved by considering not only the change in the measured quantity of a particular loop, but also the change in the measured quantity of one or more loops adjacent to the particular loop.

Figure 6:
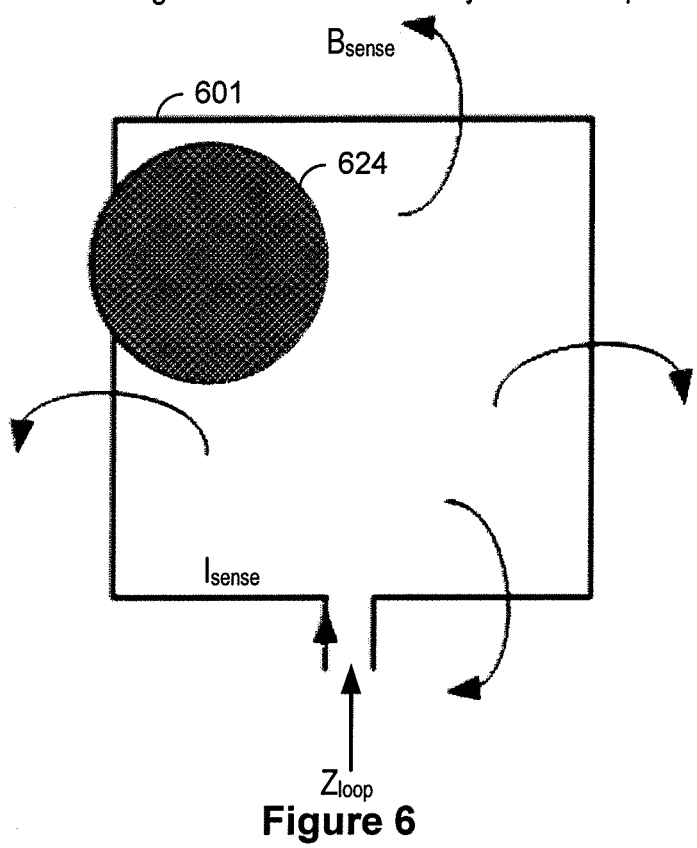
FIG. 6 is a diagram of an exemplary configuration for a loop within a loop array configured to detect an object, in accordance with an embodiment.

FIG. 6 is a diagram of an exemplary configuration for a loop within a loop array configured to detect an object, in accordance with an embodiment. In general, a sense loop 601 may be a multi-turn loop (coil). To measure the loop impedance, or inductance, a small high frequency sense current $I_{sense}$ is injected into the sense loop 601. The metal object 624 in proximity of the loop 601 modifies the magnetic flux as generated by the sense loop current $I_{sense}$ and thus modifies the loop's inductance and resistance (imaginary and real part of the impedance).

A frequency differing from the external magnetic field (e.g., another magnetic field provided for wireless energy transfer) may be used for impedance measurements in order to avoid interference from the fundamental or harmonics of the external magnetic field. In another embodiment, the resonance frequency of the sense loop 601 may be measured in order to determine the presence of an object, such as the object 624. Since the metal object 624 in proximity of the loop 601 modifies the loop's impedance, the metal object 624 will also modify a frequency at which the sense loop 601 resonates.

Large sense loops may not provide sufficiently high sensitivity as needed for detecting a coin, a key, or a lid of a beverage can, which may be significantly smaller than the area to be protected. In accordance with various embodiments for detecting small objects a plurality of smaller loops may be used according to various embodiments.

The object 624 may have the strongest impact on the impedance or resonance frequency of the sense loop 601 if placed in the center of the loop 601 and weakest impact if placed on an edge and particularly in the corner of the loop 601. It shall be noticed however that for 'edge' and 'corner' position, loop impedance and/or resonance frequency may also change in adjacent loops in the array of loops. Simultaneous changes in adjacent loops can be exploited in post processing to improve overall detection sensitivity in accordance with various embodiments as described in further detail below.

The measurement of an object's impact on the impedance or resonance frequency of the sense loops utilizes inductive sensing, which may provide several benefits. For example, inductive sensing may be highly selective on well conducting (metallic) objects and may not be impaired by other non-metallic (dielectric) objects. Inductive sensing circuitry may be integrated into the plastic enclosure of an energy transfer pad to protect sensors from environmental impacts (pollution, mechanical) with minor performance degradation. Furthermore, inductive sensing circuitry may be incorporated into the charging base since in most cases objects may be laying on the base pad surface. This may allow for cost savings in the vehicle onboard equipment.

Figure 7:
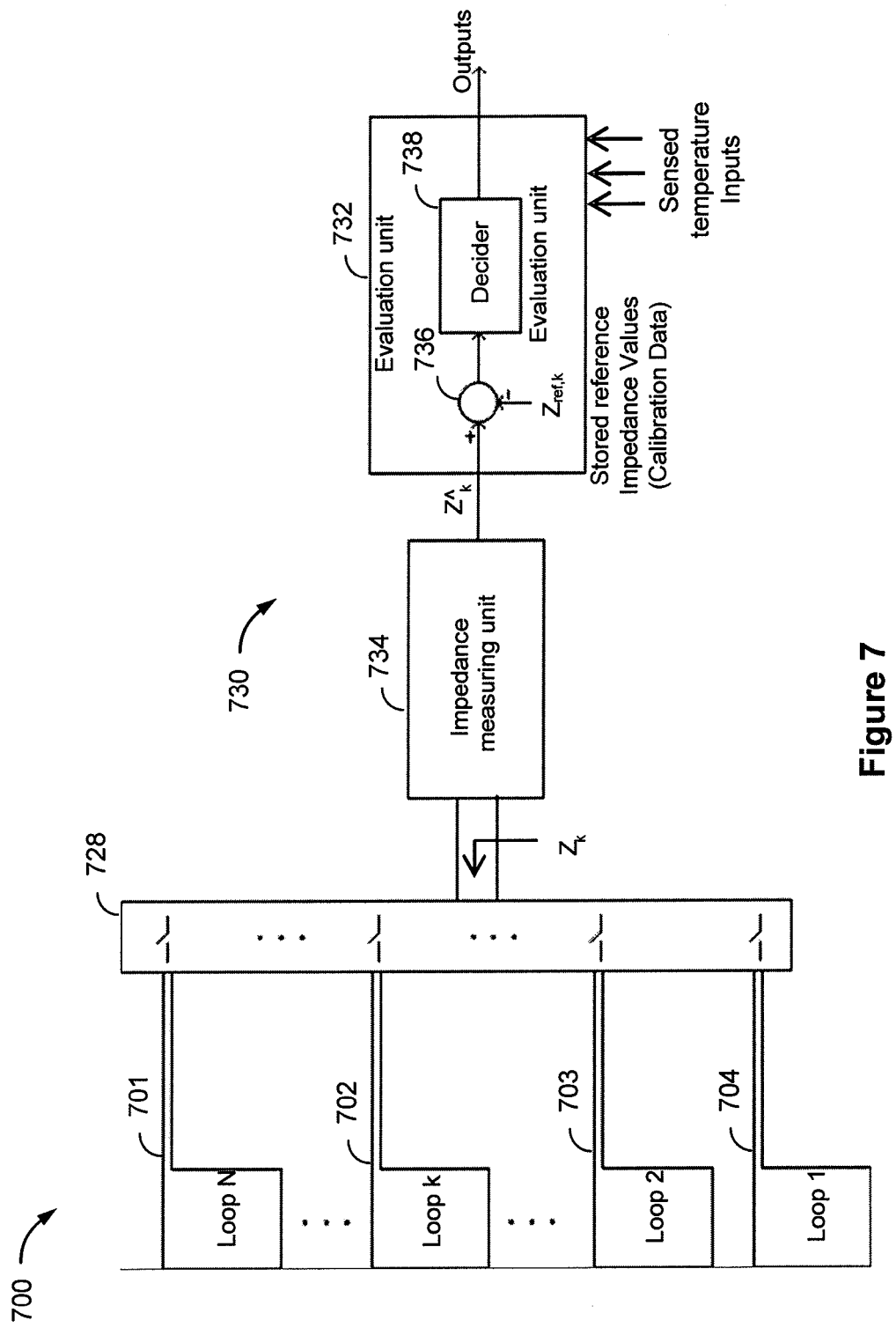
FIG. 7 is a functional block diagram of an exemplary circuit configured to detect an object based on loop impedance measurements, in accordance with an embodiment.

Several methods and embodiments are further described herein that improve performance and/or reduce wiring and circuit complexity of a loop impedance or loop resonance frequency based metal object detector. One particular embodiment includes using an array of loops and measuring their impedance to sense a metal object as shown in FIG. 7. Another particular embodiment includes using an array of resonant loops and measuring their resonant frequency to sense a metal object as shown in FIG. 8.

FIG. 7 is a functional block diagram of an exemplary circuit configured to detect an object based on loop impedance measurements, in accordance with an embodiment. The circuit 700 may include several sense loops 701, 702, 703, and 704 (referred to herein after collectively as sense loops 701-704). Although only four sense loops are shown, any number of sense loops may be utilized, in accordance with a particular application. The sense loops 701-704 may form a part of an array of densely packed wire loops that cover an area to be protected in which metal objects may be detected. In this regard, sense loops 701-704 may correspond to the sense loop array 400 previously described in connection with FIG. 4. The circuit 700 includes a detection circuit 730 that selectively couples to each of the sense loops 722 via a multiplexer 728. The detection circuit 730 includes an impedance measuring unit 734. Impedance $Z_k$ at the multiplexer port is measured for each loop 701-704 selected by the multiplexer 728 sequentially and periodically via the impedance measuring unit 734. In one embodiment, the impedance measuring unit 734 may comprise a hardware processor. A measured value of the sense loop is provided to an evaluation unit 732 including a comparator 736 and a decider 738. An object, for example, object 624 as previously discussed in connection with FIG. 6, is detected based on the differential impedance of each loop and at least one adjacent loop determined by subtracting a reference impedance value $Z_{ref,k}$ from the measured impedance value $\hat{Z}_k$ for k=1 . . . N as shown by the comparator 736. A decider unit 738 receives input from the comparator 736 regarding each loop and determines whether an object is detected based on the input regarding each loop and at least one adjacent loop. In one embodiment, the evaluation unit 734 may also comprise a hardware processor. In addition, as is further described below, the evaluation unit 732 may receive sense temperature inputs to compensate for operating conditions that may impact the measured resonant frequency due to conditions other than foreign objects.

Figure 8:
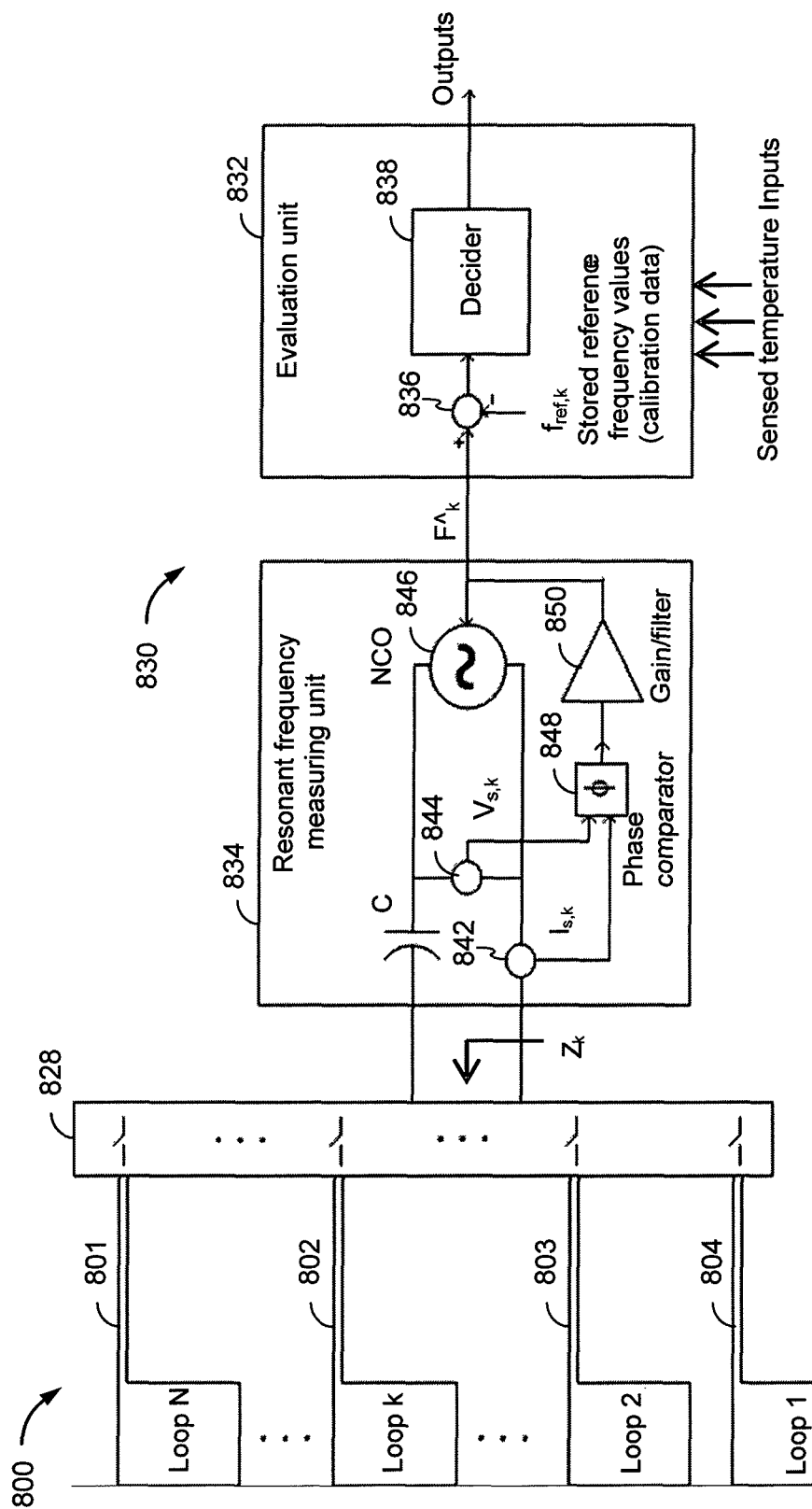
FIG. 8 is another functional block diagram of an exemplary circuit configured to detect an object based on loop resonant frequency measurements, in accordance with an embodiment.

FIG. 8 is another functional block diagram of an exemplary circuit configured to detect an object based on loop resonant frequency measurements, in accordance with an embodiment. The circuit 800 includes sense loops 801, 802, 803 and 804 (hereinafter referred to collectively as sense loops 801-804) that may be part of an array of sense loops. In some embodiments, the sense loops 801-804 may substantially be configured to define a common plane over a predetermined area to be protected. In this regard, sense loops 801-804 may correspond to the sense loop array 400 previously described in connection with FIG. 4. The sense loops 801-804 are coupled to a detection circuit 830 via a multiplexer 828 configured to selectively couple each of the sense loops 801-804 to the detection circuit 830 including a resonant frequency measuring unit 834 and an evaluation unit 832. Either or both of the detection circuit 830 and the resonant frequency measuring unit 834 may comprise a hardware processor. The resonant frequency measuring unit 834 includes a capacitor C such that a sense loop, for example sense loop 801, coupled to the resonant frequency measuring unit 834 forms a resonant circuit configured to resonate at a particular resonant frequency. In the alternative, each of the loops 801-804 may include a dedicated capacitor C for forming the resonant circuits. Such capacitors may be either parallel or series tuned, depending on the particular application. The resonant frequency measuring unit 834 includes an oscillator 846 configured to drive the coupled sense loop 801 over a range of frequencies to cause the sense loop 801 to resonate at a particular frequency. The resonant frequency measuring unit 834 further includes a phase comparator 848 configured to detect a phase between a measured voltage and current (e.g., a zero-crossing of a phase function). In addition, a gain/filter 850 may also be included.

The output of the resonant frequency measuring unit 834 may correspond to a measured resonant frequency of a particular sense loop that is provided to an evaluation unit 832 of the detection circuit 830. The evaluation unit 832 includes a comparator 836 configured to compare the received measured resonant frequency value for a sense loop 801 with a reference frequency value. The output of the comparator 836 is provided to a decider 838 configured to determine, based at least in part on a difference between the measured and reference value for each of a particular loop and at least one adjacent loop, if an object 624 is detected. Combining information from a loop and at least one adjacent loop may allow for determining position information regarding an object 624 to be more reliably detected. In addition, as is further described below, the evaluation unit 832 may receive sense temperature inputs to compensate for operating conditions that may impact the measured resonant frequency due to conditions other than foreign objects.

With reference to FIG. 8, the high frequency oscillator 846 for measuring the resonant frequency may be a Numerically Controlled Oscillator (NCO). An additional signal amplifier 850 may be needed to generate sufficient sense current in the loops and as a buffer to provide a low impedance output (voltage source-like output). The low impedance output may be advantageous to preserve the Q-factor of the sense loop circuit and thus the slope of the phase function at resonance. At least one voltage and one current sensor 844 and 842 respectively is used to provide inputs for analyzing the impedance or phase function of the sense loop 822a as seen at the input port of the resonant frequency measuring unit 834. In an embodiment, the phase comparator 848 may implement a heterodyne receiver approach, e.g., by mixing the sense signals down to a narrow-band low intermediate frequency (IF) amplifier and performing phase comparison at IF. This approach may be chosen to increase the signal-to-noise ratio and thus measurement accuracy.

The resonant frequency search may be performed by a swept frequency generator using the oscillator 846, e.g., starting at a frequency somewhat lower than the expected resonant frequency of the sense loop of concern and stopping the sweep when the differential phase reaches a predetermined value. To expedite the detection process and minimize response time, particularly in case of a large sensor array, the start frequencies may be derived from the reference values as used in the evaluation unit 832, minimizing sweep range, thus minimizing sense time per loop.

Instead of a swept frequency generator, an impulse generator (not shown) or any other pseudo-random noise generator may be used to analyze the impedance function and measure the resonant frequency. Spectral analysis techniques such as Fourier Transform techniques (DFT, FFT, Gortzel algorithm) and similar techniques operating in the numeric domain may be used. These techniques may require sampling and digitizing the sense signals (voltage and current) using an adequate analog-to-digital converter. To suppress sense loop induced transient noise as possibly generated by the energy transfer system, sweeping or pulsing may be performed in intervals between the low frequency switching transients. This method may effectively reduce noise without extra filtering requirements.

The embodiments as described with reference to FIGS. 7-8 and further herein may be enhanced by adding temperature sensors (not shown) at different places, e.g., in the charging pad (below loop sensor array) and in the impedance measuring unit in order to increase stability against ambient temperature changes. Note that environmental requirements, e.g., −30 to +80° C. may apply for a metal object detection solution that is integrated into an outdoor charging pad. Temperature as measured from different sensors may be used to pre-compensate measured impedance or resonant frequency values using a temperature model. Alternatively or additionally, different stored reference values applicable in defined temperature ranges may be used. These reference patterns may have been produced during manufacturing as part of a calibration procedure at different pad and ambient temperature levels.

In some aspects, the resonant loop method as described with reference to FIG. 8 may provide various benefits. For example, measuring a resonant frequency may be simpler and more accurate than measuring an impedance or inductance. The detection circuit 830 may have fewer components and in some aspects may be limited to using an oscillator and a phase comparator detecting the phase between measured voltage and current, e.g., the zero-crossing of the phase function. The capacitor may be also already provided to suppress voltage induced by the strong alternating magnetic field used for wireless power transfer as present on the pad's surface and harmonics noise thereof. As such adding the capacitor does not add extra complexity. The resonance may act as a sense signal pre-conditioning (noise reduction) filter that also moves accordingly if a loop 801 is detuned by a metal object. Where a single capacitor C is utilized, any temperature drift or aging of the capacitor may have a common effect on all resonant frequencies thus can be easily estimated and corrected in the evaluation unit.

As indicated above, in some aspects, the sense loop lead lines and the analog multiplexers may have a negative impact on the innate sensitivity of the loop impedance method. This may be particularly true for small loops, e.g., 30×30 mm with 3-5 turns and a lead length, e.g., above 0.5 m. Note that loops may be made of very thin copper wire/traces to avoid substantial eddy current losses when exposed to the strong magnetic field used for wireless power transfer, which may be unfavorable in regards to the innate sensitivity.

Accuracy of the loop impedance method is related to the slope of the phase in the impedance function, which is in turn related to the loop's Q-factor. A long lead to connect the loops to a central impedance measuring unit may decrease the Q factor and thus the slope of the phase as it adds resistance. The lead may also add considerable inductance. Since the object normally changes only the loop inductance, the relative change in overall impedance may become smaller with increasing lead length. Moreover, temperature and aging stability of the sense circuits may worsen for long lead lengths. These complications further highlight the need for improving the sensitivity of the foreign object detection provided by a loop array.

Similar impairments degrading temperature stability and thus the sensor's accuracy and reliability can be attributed to the analog multiplexers adding switch capacitance and significant resistance. Therefore, the loop impedance method and the related loop resonance frequency method as described above may require the analog multiplexer and the impedance measuring unit to be located as close as possible to the loop array, meaning that active circuits may have to be integrated into the charging pad 500. However, as indicated above, a capacitor, for example as shown with reference to FIG. 8, in some embodiments may be sufficient as a coupling circuit to reduce variation of the resonant frequency by the detection circuitry and multiplexer.

The embodiments described above may be used in a variety of different applications. For example, an embodiment according to those described above may be configured to detect an absence of an object, for e.g., an anti-theft system. For example, the detection circuit and sense loops may be placed proximate an object and configured to detect if the object has been removed based on a change in an electrical characteristic of the sense loop. More particularly, as another example, the detection circuit 830 may be configured to detect that a frequency at which a sense loop resonate changes when the object is removed. In this case the reference resonant frequency may be the frequency at which the sense loop resonates in the presence of an object.

The output of an impedance or resonance frequency measuring unit may require further processing in an evaluation unit (e.g., evaluation unit 732 of FIG. 7 or evaluation unit 832 of FIG. 8) of a detection circuit. With reference to FIGS. 7 and 8, for example, besides subtracting reference/calibration values and making decisions, the evaluation units 732 and/or 832 may perform a modification on the measurement samples as delivered by the measuring units. This modification may be part of a post processing method. An example of such a modification and a method is provided below in connection with FIGS. 9 and 10.

Figure 9:
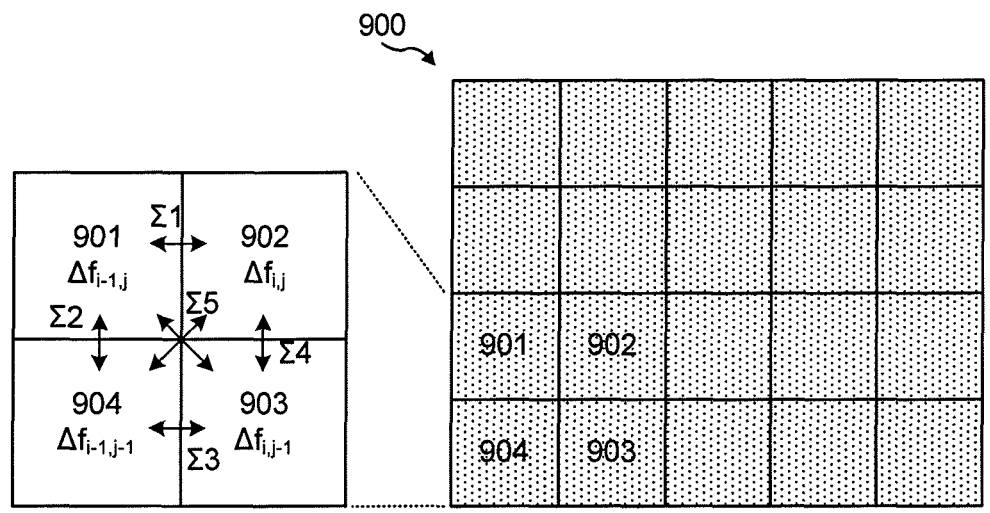
FIG. 9 is a diagram of a result matrix for detecting an object based on loop measurements, in accordance with an exemplary embodiment.

FIG. 9 is a diagram of a result matrix for detecting an object based on loop measurements, in accordance with an exemplary embodiment. Detection of a foreign object may consider the summed response of a particular sense loop and at least one adjacent sense loop in order to make optimal use of the loop array sensitivity. The term adjacent may mean immediately adjacent or adjacent within one or more sense loops of the particular sense loop. In this way, the response of $n^{th}$ neighboring loops may be incorporated in making optimal use of the loop array sensitivity. In a first step, an original 2-dimensional matrix 900 may be composed. The 2-dimensional matrix 900 may have a corresponding cell for each of the loops in a loop array, for example the loop array 400 shown in FIG. 4. Thus, the matrix 900 may have m rows and n columns, corresponding to the m rows and n columns of sense loops in the loop array 400. For example, matrix 900 may include cells 901, 902, 903 and 904 and a plurality of additional unlabeled cells. Although the following description teaches the use, measurement, determination and/or summation of loop resonance frequency values, the present application additionally contemplates the similar use of loop impedance values. Moreover, the determinations described in FIGS. 9 and 10 below may be implemented in, or carried out by, either of the circuits and/or devices shown in either of FIGS. 7 and 8. Specifically, measurements may be performed by impedance measuring unit 734 of FIG. 7 or resonant frequency measuring unit 834 of FIG. 8, while determinations, comparisons, and/or summations may be performed by evaluation unit 732 of FIG. 7 or evaluation unit 832 of FIG. 8.

The value in each cell may correspond to an absolute value of the difference ($\Delta f$) between the measured loop resonance frequency ($f_r$) for a corresponding loop and a stored calibration reference value for that loop's resonance frequency ($f_{ref}$) according to the equation:

$$\Delta f = |f_r - f_{ref}|$$

As stated above, these values may already be compensated for deviations such as temperature drift. If the pattern appears noisy, meaning that time sequentially acquired patterns show a variance, a temporal and/or a spatial averaging technique may apply, e.g., moving average, exponential decay averaging (e.g., $1^{st}$ order infinite response filter) over sequentially acquired patterns and/or spatial filtering/smoothing. As stated previously, in another embodiment the value in each matrix cell may correspond to an absolute value of the difference between the measured loop impedance for a corresponding loop and a stored calibration reference value for that loop's impedance.

Figure 10:
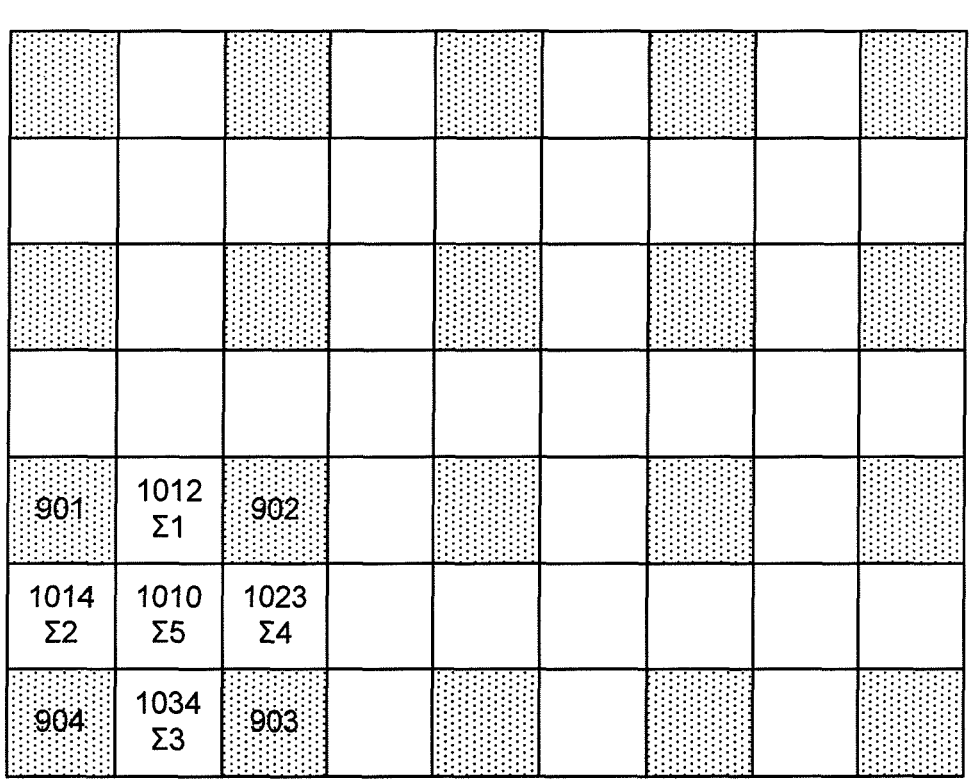
FIG. 10 is a diagram of an extended result matrix for detecting an object based on loop measurements and adjacent loop measurements, in accordance with an exemplary embodiment.

Once the loop resonance frequency differences $\Delta f$ are determined, a sum of the difference $\Delta f$ for each loop and the difference $\Delta f$ for at least one adjacent loop may be determined and mapped to an extended matrix such as that shown in connection with FIG. 10. FIG. 10 is a diagram of an extended result matrix for detecting an object based on loop measurements and adjacent loop measurements, in accordance with an exemplary embodiment. Extended matrix 1000 may include 2m−1 rows and 2n−1 columns corresponding to the m rows and n columns of the result matrix 900 and the m rows and n columns of sense loops in the corresponding loop array. For the purpose of explanation and not limitation, the cells 901-904, as shown in FIG. 9, are reproduced in the extended matrix 1000 of FIG. 10. The extended matrix 1000 may essentially comprise each cell of results matrix 900 of FIG. 9 separated from each adjacent cell of results matrix 900 by one additional cell. For example, cell 1012 separates cell 901 from cell 902, cell 1023 separates cell 902 from cell 903, cell 1034 separates cell 903 from 904, cell 1014 separates cell 901 from cell 904, and cell 1010 separates each of cells 901-904 from a diagonally adjacent cell. Cells 1012, 1014, 1034, 1023 and 1010 may hold sum values $\Sigma 1$, $\Sigma 2$, $\Sigma 3$, $\Sigma 4$, and $\Sigma 5$, as shown in FIG. 9 according to the following equations:

$$\Sigma 1 = \Delta f_{i,j} + \Delta f_{i-1,j}$$

$$\Sigma 2 = \Delta f_{i-1,j-1} + \Delta f_{i-1,j}$$

$$\Sigma 3 = \Delta f_{i-1,j-1} + \Delta f_{i,j-1}$$

$$\Sigma 4 = \Delta f_{i,j} + \Delta f_{i,j-1}$$

$$\Sigma 5 = \Delta f_{i,j} + \Delta f_{i,j-1} + \Delta f_{i-1,j} + \Delta f_{i-1,j-1}$$

where i=1 . . . n and j=1 . . . m.

In one embodiment, depending on the actual geometrical embodiment of the sense loops in the loop array, it may be advantageous to introduce an additional weighting factor for each loop response. In such an embodiment, sum values $\Sigma 1$, $\Sigma 2$, $\Sigma 3$, $\Sigma 4$, and $\Sigma 5$ may be calculated according to the following equations:

$$\Sigma 1 = a\Delta f_{i,j} + b\Delta f_{i-1,j}$$

$$\Sigma 2 = c\Delta f_{i-1,j-1} + b\Delta f_{i-1,j}$$

$$\Sigma 3 = c\Delta f_{i-1,j-1} + d\Delta f_{i,j-1}$$

$$\Sigma 4 = a\Delta f_{i,j} + d\Delta f_{i,j-1}$$

$$\Sigma 5 = a\Delta f_{i,j} + d\Delta f_{i,j-1} + c\Delta f_{i-1,j} + b\Delta f_{i-1,j-1}$$

where the coefficients a, b, c and d may have any value, including negative values, although a value between 0.25 and 2 may be most desirable.

Figure 11:
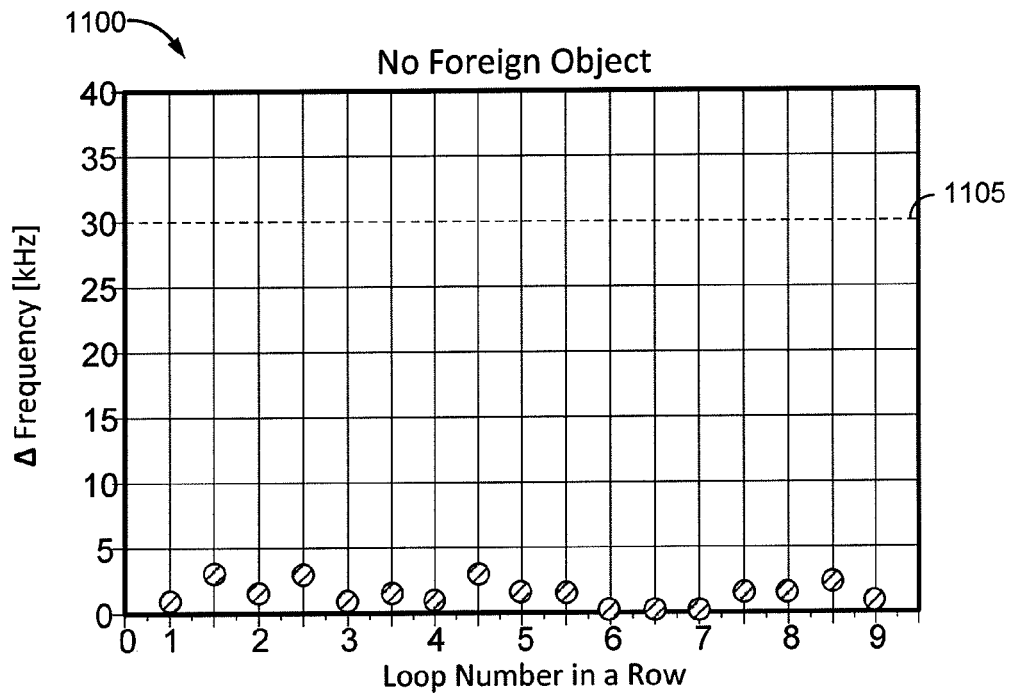
FIG. 11 is a chart illustrating loop resonance frequencies when no foreign object is present, in accordance with an exemplary embodiment.
Figure 12:
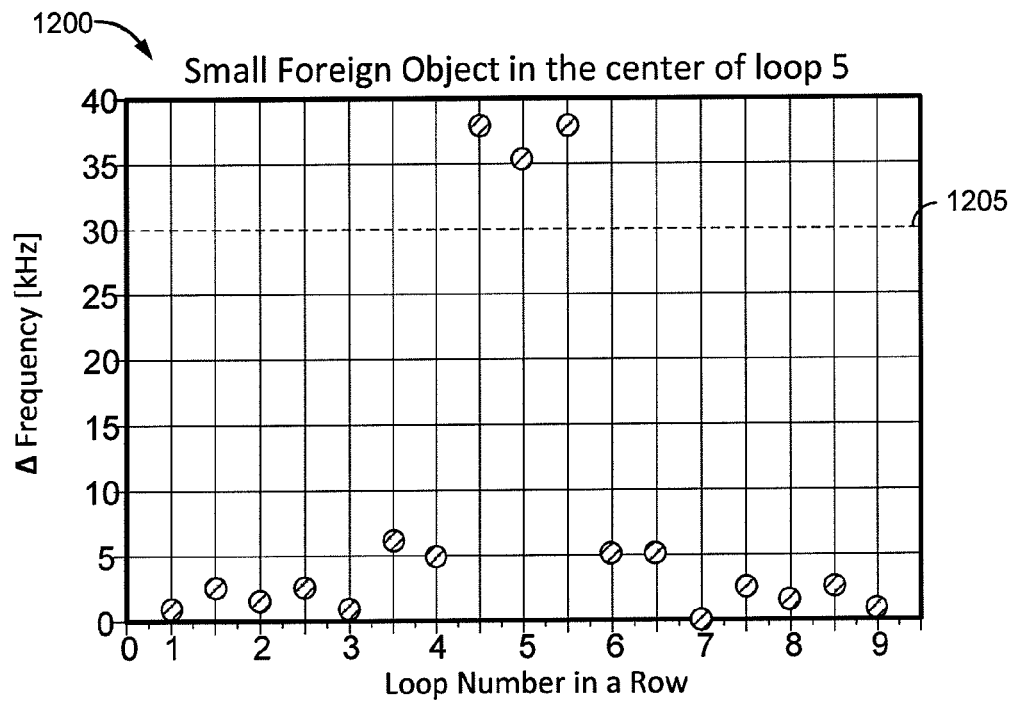
FIG. 12 is another chart illustrating changes in loop resonance frequencies when a foreign object is present in the center of a loop, in accordance with an exemplary embodiment.
Figure 13:
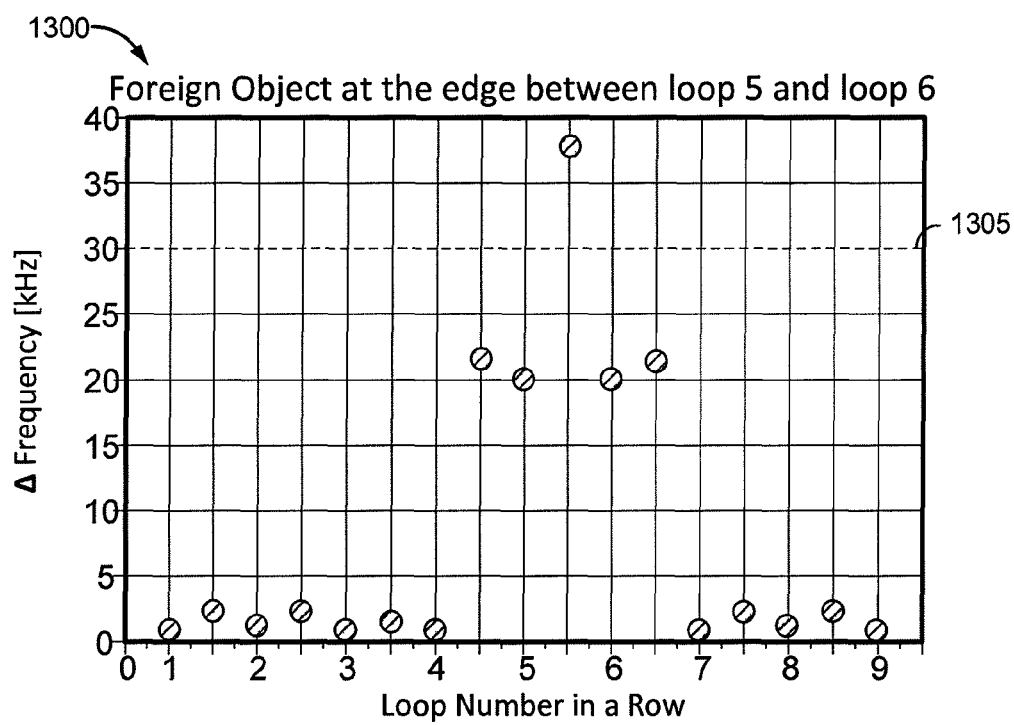
FIG. 13 is another chart illustrating changes in loop resonance frequencies when a foreign object is present at an edge between two loops, in accordance with an exemplary embodiment.

In one embodiment, these coefficients may be dynamically adjusted depending on the particular environment. Thus, by utilizing a sum of loop resonance frequency differences M for each loop and at least one adjacent loop, a sensitivity of the loop array may be improved. In another embodiment, where loop impedance is measured, each of the sum values $\Sigma 1$, $\Sigma 2$, $\Sigma 3$, $\Sigma 4$, and $\Sigma 5$ described in both of the equation sets above may comprise sums of the loop and adjacent loop impedances rather than sums of the loop and adjacent loop resonance frequencies, with all other relations unchanged. Several examples further describing how utilizing sums as previously described improves sensitivity will be presented in connection with FIGS. 11-13 below. Although the examples shown in FIGS. 11-13 are with respect to changes in loop resonance frequencies, they are equally applicable to embodiments where changes in loop impedances are measured and determined. Moreover, the measurements, determinations, comparisons, and/or summations described in FIGS. 11-13 below may be implemented in, or carried out by, either of the circuits and/or devices shown in either of FIGS. 7 and 8. Specifically, measurements may be performed by impedance measuring unit 734 of FIG. 7 or resonant frequency measuring unit 834 of FIG. 8, while determinations, comparisons, and/or summations may be performed by evaluation unit 732 of FIG. 7 or evaluation unit 832 of FIG. 8.

FIG. 11 is a chart illustrating example loop resonance frequencies when no foreign object is present, in accordance with an exemplary embodiment. Chart 1100 shows the measured values for each of 9 exemplary loops in a row of a loop array as well as the computed sums of adjacent loops in between each of the 9 loop values. As shown, an exemplary detection threshold 1105 at which the object detector may reliably determine that an object is present over a particular loop may be approximately 30 kHz. However, this detection threshold is exemplary only, and is not to be construed as limiting as the detection threshold may be any appropriate value depending on the particular application. Loops 6 and 7 may measure $\Delta f$ values of 0 kHz, meaning that their current resonance frequencies are substantially the same as the reference/calibration values for those loops. Loops 1, 3, 4 and 9 may each measure $\Delta f$ values of approximately 1 kHz, while loops 2, 5, and 8 may each measure $\Delta f$ values of approximately 2 kHz. These values of 1 kHz and 2 kHz may represent a noise amplitude that is within the expected tolerances for the loops of the loop array. As shown, calculated sum values of the measured values for adjacent loops appear between the loop measured values. For example, because both loops 6 and 7 measure a Δf value of 0 kHz, their sum would also be approximately 0 kHz as shown by the value between loops 6 and 7. Likewise, the sum values between each of the other adjacent loops appear as the sum of the respective adjacent loops. Since no object is present, no measured or summed values for loops exceed the detection threshold 1105 and no object is detected.

FIG. 12 is another chart illustrating changes in loop resonance frequencies when a foreign object is present in the center of a loop, in accordance with an exemplary embodiment. Chart 1200 shows the measured values for each of the 9 exemplary loops in a row of a loop array as well as the computed sums of adjacent loops in between each of the 9 loop values. As shown, an exemplary detection threshold 1205 at which the object detector may reliably determine that an object is present over a particular loop may again be approximately 30 kHz. However, the detection threshold may be any appropriate value depending on the particular application. Because a foreign object is located in the center of loop 5, the measured Δf value associated with loop 5 may be 35 kHz, exceeding the detection threshold. Because loops 4 and 6 are adjacent to loop 5, the proximity of the foreign object to each of loops 4 and 6 may cause the measured Δf values for loops 4 and 6 to rise somewhat, though to a level substantially lower than the detection threshold 1205. As shown, the summed Δf values between loops 4 and 5 as well as between loops 5 and 6 are elevated substantially over the detection threshold 1205. In this case, the presence of the foreign object would be detectable without the use of the sum of adjacent loops' Δf values. However, this is attributable to the object being located in the center of loop 5. The particular advantages for increased sensitivity may be more apparent when the foreign object is located at an edge between two loops, as described in connection with FIG. 13 below.

FIG. 13 is another chart illustrating changes in loop resonance frequencies when a foreign object is present at an edge between two loops, in accordance with an exemplary embodiment. Chart 1300 shows the measured values for each of the 9 exemplary loops in a row of a loop array as well as the computed sums of adjacent loops in between each of the 9 loop values. As shown, an exemplary detection threshold 1305 at which the object detector may reliably determine that an object is present over a particular loop may again be approximately 30 kHz. However, the detection threshold may be any appropriate value depending on the particular application. Because the foreign object is located at an edge between loops 5 and 6, the measured Δf values associated with loops 5 and 6 may be elevated to a sub-threshold value of 20 kHz, for example. In an embodiment where summing adjacent loop Δf measurements are not used, the loop array would not detect the foreign object because the measured values for Δf are below the detection threshold 1305. However, the sum of the Δf measurements for loops 5 and 6 result in a value substantially greater than the detection threshold 1305, allowing the loop array to detect the presence of the foreign object even though measured values for the Δf of each of the loops remains substantially below the detection threshold 1305. Thus, by summing the Δf measurements for adjacent loops, the sensitivity of the loop array may be increased without substantially increasing the occurrence of false alarms.

Figure 14:
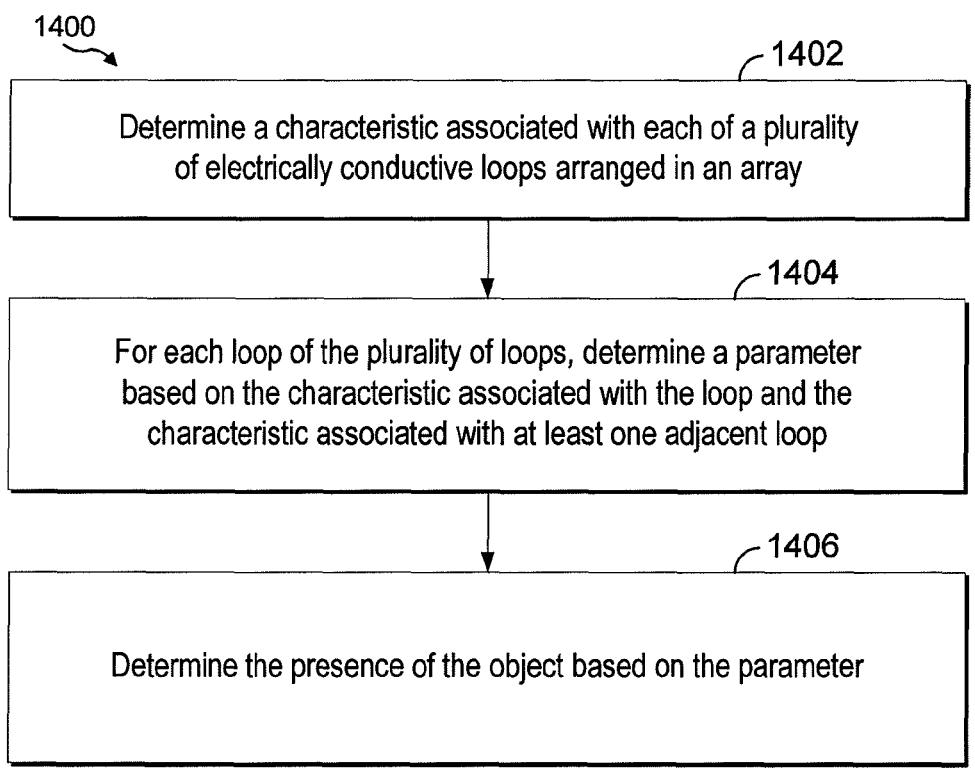
FIG. 14 is a flowchart of an exemplary method for detecting the presence of an object, in accordance with an exemplary embodiment.

FIG. 14 is a flowchart of an exemplary method 1400 for detecting the presence of an object, in accordance with an exemplary embodiment. The steps or actions described in FIG. 14 may be implemented in, or carried out by, either of the circuits and/or devices shown in either of FIGS. 7 and 8. Block 1402 may include determining a characteristic associated with each of a plurality of electrically conductive loops arranged in an array. In one embodiment the characteristic may comprise a loop resonance frequency. In another embodiment the characteristic may comprise a loop impedance. Block 1404 may include, for each loop of the plurality of loops, determining a parameter based on the characteristic associated with the loop and the characteristic associated with at least one adjacent loop. In one embodiment, determining the parameter may comprise determining the sum of a difference between the characteristic associated with the loop and a reference value for the characteristic, and a difference between the characteristic associated with each of the at least one adjacent loop and the reference value, as previously described in connection with FIGS. 9 and 10. In another embodiment, weighting factors may be applied to each of the determined difference values based on a geometrical arrangement of the plurality of loops. For example, where a loop is located on an outside row or column of the loop array a particular weighting factor may be applied to any determined difference value. Alternatively, where a sum is taken of a loop's difference value and of the three adjacent loop's difference values, as described with respect to Σ5 in FIG. 10, another weighting factor may be applied to each of the determined difference values. In another embodiment, the parameter for each loop may compensate for a drift in the characteristic associated with each of the plurality of loops due to temperature, as described in more detail in connection with FIGS. 16-21 below. Block 1406 may include determining the presence of the object based on the parameter. For example, in one embodiment, the presence of an object may be identified when the value of the parameter is greater than a detection threshold as described above in connection with FIGS. 11-13. In an embodiment, for example, the method 1400 may be performed by either of the circuits 700 or 800 of FIGS. 7 and 8, respectively.

Figure 15:
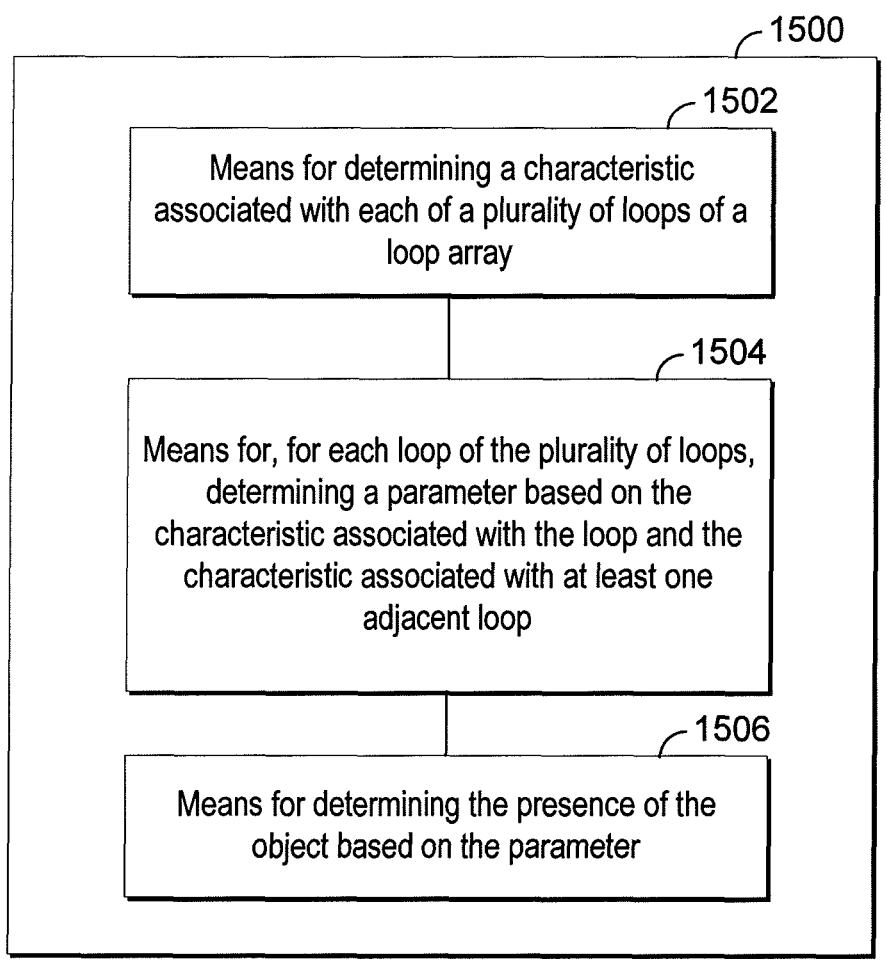
FIG. 15 is a functional block diagram of an apparatus for detecting the presence of an object, in accordance with an exemplary embodiment.

FIG. 15 is a functional block diagram of an apparatus for detecting the presence of an object, in accordance with an exemplary embodiment. Those skilled in the art will appreciate that an apparatus or detecting the presence of an object may have more components than the simplified apparatus 1500 for detecting the presence of an object shown in FIG. 15. The apparatus 1500 shown includes only those components useful for describing some prominent features of embodiments within the scope of the claims.

The apparatus 1500 includes means 1502 for determining a characteristic associated with each of a plurality of loops of a loop array. In an embodiment, the means 1502 for determining a characteristic associated with each of the plurality of loops of the loop array can be configured to perform one or more of the functions described above with respect to block 1402 (FIG. 14). In various embodiments, the means 1502 for determining a characteristic associated with each of the plurality of loops of the loop array can be implemented by one or more of the impedance measuring unit 734 or the resonance frequency measuring unit 834 of FIGS. 7 and 8, respectively.

The apparatus 1500 further includes means 1504 for, for each loop of the plurality of loops, determining a parameter based on the characteristic associated with the loop and the characteristic associated with at least one adjacent loop. In an embodiment, the means 1504 can be configured to perform one or more of the functions described above with respect to block 1404 (FIG. 14). In various embodiments, the means 1504 can be implemented by one or more of the evaluation unit 732 or 832 of FIGS. 7 and 8, respectively.

The apparatus 1500 further includes means 1506 for determining the presence of the object based on the parameter. In an embodiment, the means 1506 for determining the presence of the object based on the parameter can be configured to perform one or more of the functions described above with respect to block 1406 (FIG. 14). In various embodiments, the means 1506 for determining the presence of the object based on the parameter can be implemented by one or more of the evaluation unit 732 or 832 of FIGS. 7 and 8, respectively.

As previously discussed, temperature variations may cause fluctuations in the impedance and/or resonance frequency of one or more affected sense loops in the sense loop array. Such fluctuations can result in false alarms or failures in detecting the presence of a foreign object in proximity to the sense loop array. Accordingly, it is desirable to minimize or eliminate the effect such fluctuations have on the detection of foreign objects.

Figures 16, 17:
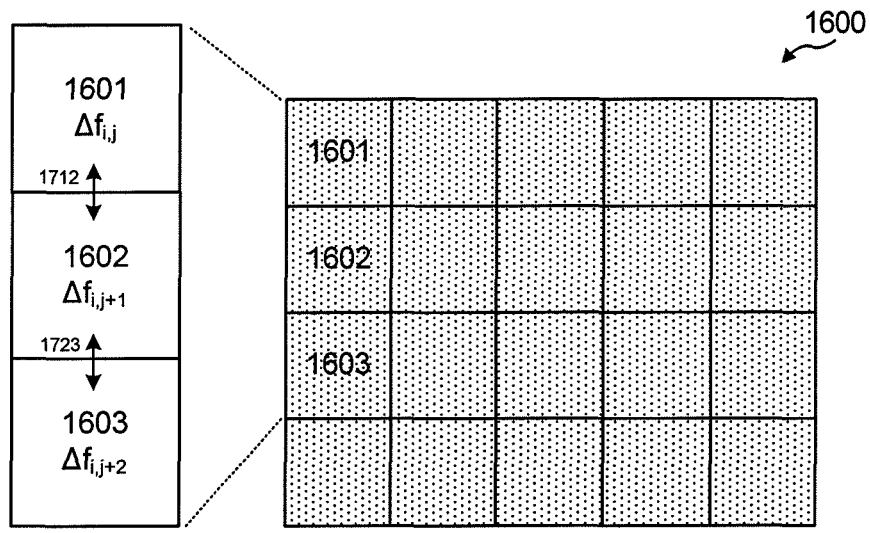
FIG. 16 is a diagram of a result matrix for detecting an object based on loop measurements and correcting for temperature variations, in accordance with an exemplary embodiment.
FIG. 17 is a diagram of a condensed result matrix for detecting an object based on loop measurements, adjacent loop measurements and correcting for temperature variations, in accordance with an exemplary embodiment.

FIG. 16 is a diagram of a result matrix for detecting an object based on loop measurements and correcting for temperature variations, in accordance with an exemplary embodiment. Attenuation or elimination of the effect of temperature variations can be achieved by considering the difference between the drift in impedance and/or resonance frequency for adjacent loops. In a first step, an original 2-dimensional matrix 1600 may be composed. The 2-dimensional matrix 1600 may have a corresponding cell for each of the loops in a loop array, for example the loop array 400 shown in FIG. 4. Thus, the matrix 1600 may have m rows and n columns, corresponding to the m rows and n columns of sense loops in the loop array 400. For example, matrix 1600 may include cells 1601, 1602, 1603 and 1604 and a plurality of additional unlabeled cells. Although the following description teaches the use, measurement, determination and/or summation of loop resonance frequency values, the present application additionally contemplates the similar use of loop impedance values. Moreover, the determinations described in FIGS. 16 and 17 below may be implemented in, or carried out by, either of the circuits and/or devices shown in either of FIGS. 7 and 8. Specifically, measurements may be performed by impedance measuring unit 734 of FIG. 7 or resonant frequency measuring unit 834 of FIG. 8, while determinations, comparisons, and/or difference calculations may be performed by evaluation unit 732 of FIG. 7 or evaluation unit 832 of FIG. 8.

The value in each cell may correspond to an absolute value of the difference ($\Delta f$) between the measured loop resonance frequency ($f_t$) for a corresponding loop and a stored calibration reference value for that loop's resonance frequency ($f_{ref}$) according to the equation:

$$\Delta f = |f_t - f_{ref}|$$

As stated above with regard to FIG. 9, these values may already be pre-compensated for deviations such as temperature drift. If the pattern appears noisy, meaning that time sequentially acquired patterns show a variance, a temporal and/or a spatial averaging technique may apply, e.g., moving average, exponential decay averaging (e.g., $1^{st}$ order infinite response filter) over sequentially acquired patterns and/or spatial filtering/smoothing. As stated previously, in another embodiment the value in each matrix cell may correspond to an absolute value of the difference between the measured loop impedance for a corresponding loop and a stored calibration reference value for that loop's impedance.

Once the loop resonance frequency differences $\Delta f$ are determined, a difference between the $\Delta f$ for each loop and the $\Delta f$ for an adjacent loop having lead lines routed substantially together may be determined and mapped to a condensed matrix such as that shown in connection with FIG. 17. FIG. 17 is a diagram of a condensed result matrix for detecting an object based on loop measurements, adjacent loop measurements and correcting for temperature variations, in accordance with an exemplary embodiment. Condensed matrix 1700 may include m−1 rows and n columns corresponding to the m rows and n columns of the result matrix 900 and the m rows and n columns of sense loops in the corresponding loop array. This may be the case where lead lines for all sense loops in a column of the sense loop array are routed together. In the alternative, where all lead lines are grouped and routed together by rows, the condensed matrix 1700 would include m rows and n−1 columns. Considering loops in the same column, difference values $\Delta_{n\Delta f}$ can be calculated for each cell in matrix 1700 according to the equation:

$$\Delta_{n\Delta f} = |\Delta f_{i,j} - \Delta f_{i,j+1}|$$

where i=1 . . . n and j=1 . . . m.

Thus, by way of example, cells 1712 and 1723 may hold difference values $\Delta_{1\Delta f}$ and $\Delta_{2\Delta f}$ respectively, as shown in FIG. 17 according to the following equations:

$$\Delta_{1\Delta f} = |\Delta f_{i,j} - \Delta f_{i,j+1}|$$

$$\Delta_{2\Delta f} = |\Delta f_{i,j+1} - \Delta f_{i,j+2}|$$

The calculated difference values of the cells of condensed matrix 1700 may then be compared with a detection threshold to determine the presence or absence of a foreign object. Thus, by considering a difference between loop resonance frequency differences $\Delta f$ for each loop and an adjacent loop both having lead lines routed substantially together, common drift in the resonance frequency and/or impedance of the lead lines due to temperature variations within the loop and the adjacent loop may be cancelled out. Moreover, because any drift happening to a particular loop and the adjacent loop is effectively cancelled, this procedure also cancelled out any temperature drift caused by the detection electronics where the same detection circuit is utilized to measure the impedance and/or resonance frequency for both loops, as previously described in connection with FIGS. 7 and 8. In another embodiment, where loop impedance is measured, each of the difference values $\Delta_{n\Delta f}$ described above may comprise differences of the loop and adjacent loop impedances rather than differences of the loop and adjacent loop resonance frequencies, with all other relations unchanged. Several examples further describing how utilizing differences as described in connection with FIGS. 16 and 17 improve sensitivity while correcting for temperature variations will be presented in connection with FIGS. 18-21 below. Although the examples shown in FIGS. 18-21 are with respect to changes in loop resonance frequencies, they are equally applicable to embodiments where changes in loop impedances are measured and determined. Moreover, the measurements, determinations, comparisons, and/or summations described in FIGS. 18-21 below may be implemented in, or carried out by, either of the circuits and/or devices shown in either of FIGS. 7 and 8. Specifically, measurements may be performed by impedance measuring unit 734 of FIG. 7 or resonant frequency measuring unit 834 of FIG. 8, while determinations, comparisons, and/or difference calculations may be performed by evaluation unit 732 of FIG. 7 or evaluation unit 832 of FIG. 8.

Figure 18:
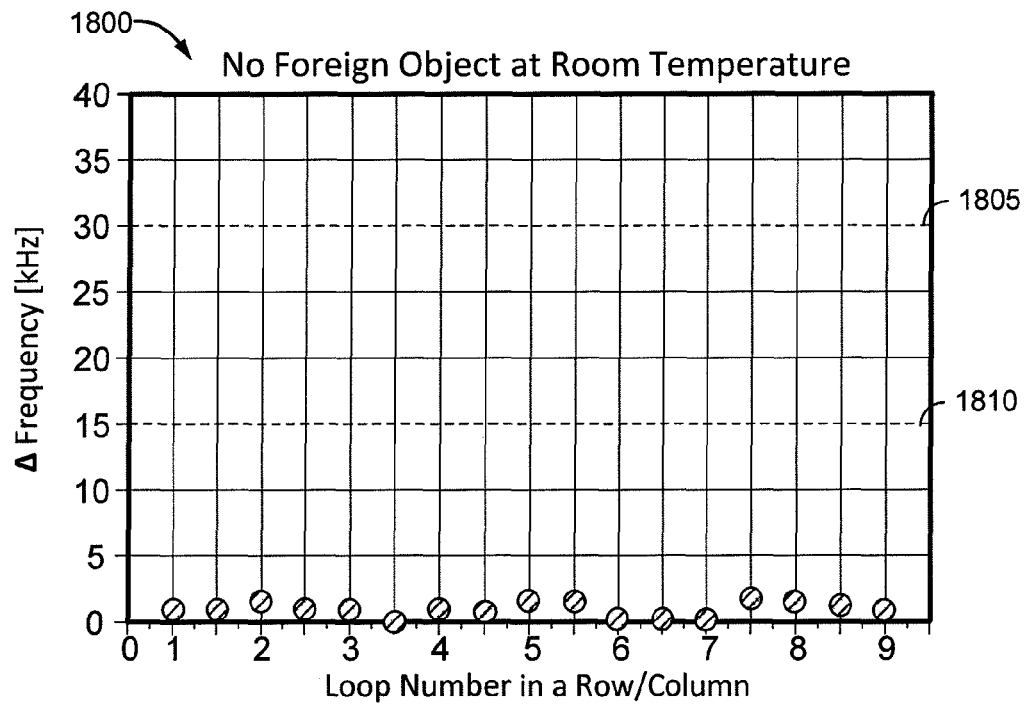
FIG. 18 is a chart illustrating loop resonance frequencies when no foreign object is present at room temperature, in accordance with an exemplary embodiment.

FIG. 18 is a chart illustrating loop resonance frequencies when no foreign object is present at room temperature, in accordance with an exemplary embodiment. Chart 1800 shows the measured values for each of 9 exemplary loops in a row of a loop array as well as the computed differences between adjacent loops of the 9 loops. As shown, an exemplary absolute detection threshold 1805 at which the object detector would normally reliably determine that an object is present over a particular loop may be approximately 30 kHz. However, this absolute detection threshold is exemplary only, and is not to be construed as limiting as the detection threshold may be any appropriate value depending on the particular application. Similarly, an exemplary differential detection threshold 1810 at which the object detector may reliably determine, accounting for temperature drift, that an object is present over a particular loop may be approximately 15 kHz. However, this differential detection threshold is exemplary only, and is not to be construed as limiting as the detection threshold may be any appropriate value depending on the particular application. Loops 6 and 7 may measure Δf values of 0 kHz, meaning that their current resonance frequencies are substantially the same as the reference/calibration values for those loops. Loops 1, 3, 4 and 9 may each measure Δf values of approximately 1 kHz, while loops 2, 5, and 8 may each measure Δf values of approximately 2 kHz. These values of 1 kHz and 2 kHz may represent a noise amplitude that is within the expected tolerances for the loops of the loop array. Because the loops and lead lines are at substantially room temperature, no appreciable temperature drift is shown. As shown, calculated difference values between the measured values for adjacent loops appear between the loop measured values. For example, because both loops 6 and 7 measure a Δf value of ° kHz, their difference would also be approximately 0 kHz as shown by the value between loops 6 and 7. Likewise, the difference values between each of the other adjacent loops appear as the difference between the respective adjacent loops. Since no object is present, no measured or difference values exceed either of the detection thresholds 1805 or 1810 and no object is detected.

Figure 19:
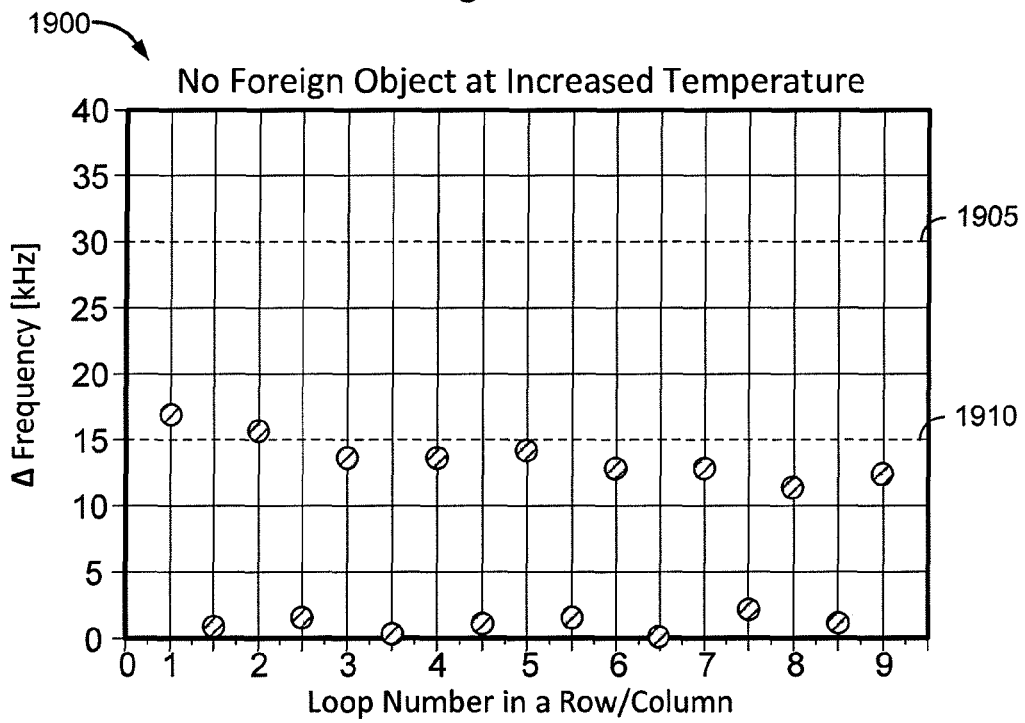
FIG. 19 is another chart illustrating changes in loop resonance frequencies when no foreign object is present at an increased temperature, in accordance with an exemplary embodiment.

FIG. 19 is another chart illustrating changes in loop resonance frequencies when no foreign object is present at an increased temperature, in accordance with an exemplary embodiment. Chart 1900 shows the measured values for each of the 9 exemplary loops in a row of a loop array as well as the computed differences between adjacent loops between each of the 9 loop values. An exemplary absolute detection threshold 1905 at which the object detector would normally reliably determine that an object is present over a particular loop may be approximately 30 kHz. Similarly, an exemplary differential detection threshold 1910 at which the object detector may reliably determine, accounting for temperature drift, that an object is present over a particular loop may be approximately 15 kHz. However, these detection thresholds are exemplary only, and not to be construed as limiting as the detection thresholds may be any appropriate values depending on the particular application. As shown, as the temperature begins to rise, the measured difference values associated with each of the loops begin to drift upward and away from zero. For example, the measured values for each of loops 1 and 2 exceed the differential detection threshold 1910. However, because they are measured values and not the determined difference values between adjacent loops, the measured values do not trigger a foreign object detection alarm. As the drift for adjacent loops is very similar, the determined difference values between adjacent loops remain close to 0 kHz.

Figure 20:
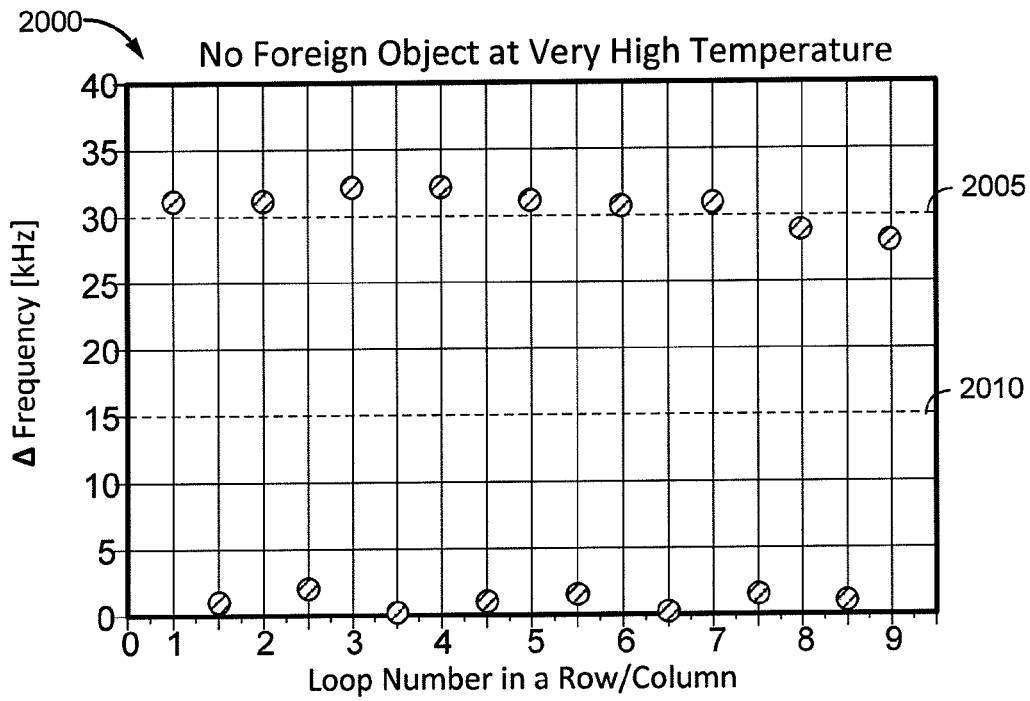
FIG. 20 is another chart illustrating changes in loop resonance frequencies when no foreign object is present at substantially increased temperature, in accordance with an exemplary embodiment.

FIG. 20 is another chart illustrating changes in loop resonance frequencies when no foreign object is present at substantially increased temperature, in accordance with an exemplary embodiment. Chart 2000 shows the measured values for each of the 9 exemplary loops in a row of a loop array as well as the computed differences between adjacent loops. An exemplary absolute detection threshold 2005 at which the object detector would normally reliably determine that an object is present over a particular loop may be approximately 30 kHz. Similarly, an exemplary differential detection threshold 2010 at which the object detector may reliably determine, accounting for temperature drift, that an object is present over particular loops may be approximately 15 kHz. However, these detection thresholds are exemplary only, and not to be construed as limiting as the detection thresholds may be any appropriate values depending on the particular application. As the temperature is even higher than that shown in FIG. 18 or 19, the measured values for each of the loops drift even further upward and away from zero. Because the measured values have drifted so far that many of them exceed the absolute detection threshold 2005, a false alarm would normally be triggered. However, because the differential values each remain significantly below the differential detection threshold 2010, no false alarm will be triggered.

Figure 21:
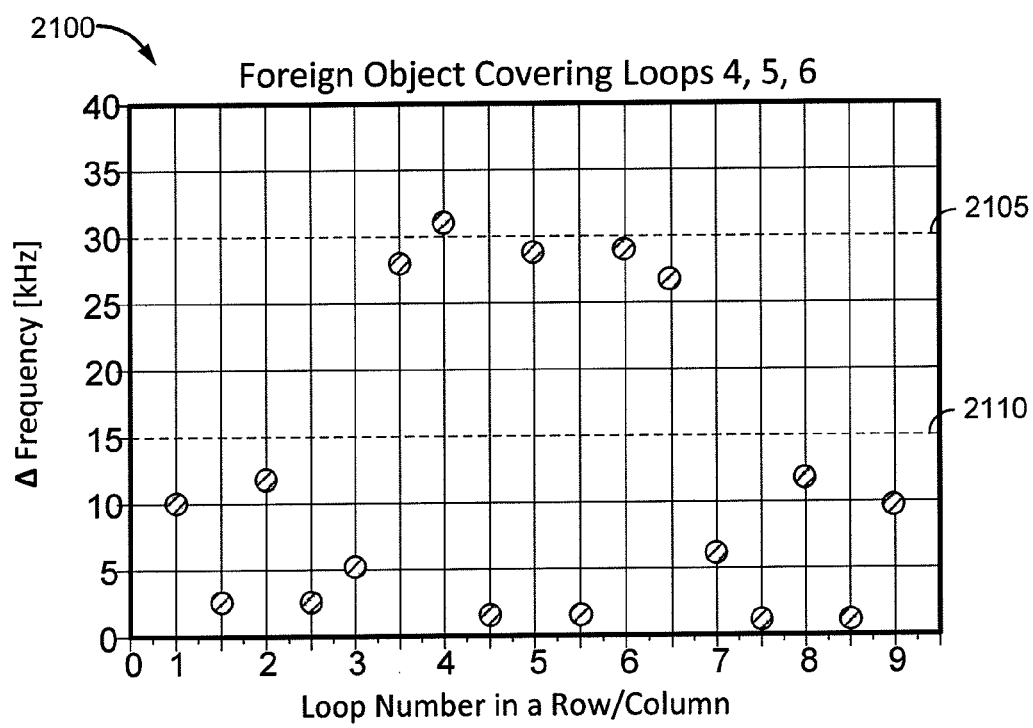
FIG. 21 is another chart illustrating changes in loop resonance frequencies when a foreign object is present, in accordance with an exemplary embodiment.

FIG. 21 is another chart illustrating changes in loop resonance frequencies when a foreign object is present, in accordance with an exemplary embodiment. Chart 2100 shows the measured values for each of the 9 exemplary loops in a row of a loop array as well as the computed differences between adjacent loops when a foreign object is present over the exemplary loops 4, 5 and 6. An exemplary absolute detection threshold 2105 at which the object detector would normally reliably determine that an object is present over a particular loop may be approximately 30 kHz. Similarly, an exemplary differential detection threshold 2110 at which the object detector may reliably determine, accounting for temperature drift, that an object is present over particular loops may be approximately 15 kHz. However, these detection thresholds are exemplary only, and not to be construed as limiting as the detection thresholds may be any appropriate values depending on the particular application. Because the foreign object is present over loops 4, 5 and 6, the measure Δf values for each of loops 4, 5 and 6 may be substantially elevated. For example, the measured Δf value for loop 4 may exceed the absolute detection threshold 2105. Because the foreign object is not present over loops 3 and 7, the measured Δf values for loops 3 and 7 are substantially below the absolute detection threshold 2105. However, the calculated difference between loops 3 and 4 and the calculated difference between loops 6 and 7 are large enough to exceed the differential detection threshold 2110, and trigger the determination that a foreign object is present. Furthermore, because the differential detection threshold 2110 can be lower than the absolute detection threshold 2105, overall system sensitivity and robustness can be increased.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and method steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such embodiment decisions should not be interpreted as causing a departure from the scope of the embodiments.

The various illustrative blocks, modules, and circuits described in connection with the embodiments disclosed herein may be implemented or performed with a general purpose hardware processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose hardware processor may be a microprocessor, but in the alternative, the hardware processor may be any conventional processor, controller, microcontroller, or state machine. A hardware processor may also be implemented as a combination of computing devices, e.g., a combination of a DSP and a microprocessor, a plurality of microprocessors, one or more microprocessors in conjunction with a DSP core, or any other such configuration.

The steps of a method and functions described in connection with the embodiments disclosed herein may be embodied directly in hardware, in a software module executed by a hardware processor, or in a combination of the two. If implemented in software, the functions may be stored on or transmitted as one or more instructions or code on a tangible, non-transitory computer readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the hardware processor such that the hardware processor can read information from, and write information to, the storage medium. In the alternative, the storage medium may be integral to the hardware processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The hardware processor and the storage medium may reside in an ASIC. The ASIC may reside in a user terminal. In the alternative, the hardware processor and the storage medium may reside as discrete components in a user terminal.

For purposes of summarizing the disclosure, certain aspects, advantages and novel features s have been described herein. It is to be understood that not necessarily all such advantages may be achieved in accordance with any particular embodiment. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the application. Thus, the present application is not intended to be limited to the embodiments shown herein but is to be accorded the widest scope consistent with the principles and novel features disclosed herein.

What is claimed is:

1. An apparatus for detecting a presence of an object, comprising:
    a plurality of electrically conductive loops arranged in an array;
    a sensor circuit configured to determine a characteristic comprising a loop resonance frequency associated with each of the plurality of loops;
    a hardware processor configured to:
        for each loop of the plurality of loops, determine a parameter comprising a sum of a deviation of the characteristic associated with the loop from a reference value and a deviation of the characteristic associated with at least one adjacent loop from the reference value, wherein the parameter for at least two of the plurality of loops includes a deviation of the characteristic associated with the same adjacent loop; and
        determine the presence of the object based on the parameter.

2. The apparatus of claim 1, wherein the characteristic further comprises loop impedance.

3. The apparatus of claim 1, wherein the hardware processor is further configured to apply a weighting factor to each of the deviations based on a geometrical arrangement of the plurality of loops.

4. The apparatus of claim 1, wherein the hardware processor is further configured to compensate for a drift in the characteristic associated with each of the plurality of loops due to temperature by determining the parameter as a difference between the deviation of the characteristic associated with the loop from the reference value for the characteristic, and the deviation of the characteristic associated with the adjacent loop from the reference value.

5. The apparatus of claim 4, wherein lead lines for the loop and for the adjacent loop are physically routed substantially together.

6. The apparatus of claim 4, wherein the hardware processor is configured to cancel out common drift in the characteristic associated with the loop and the adjacent loop.

7. The apparatus of claim 1, wherein the plurality of loops do not overlap.

8. The apparatus of claim 1, wherein the plurality of loops overlap.

9. A method for detecting a presence of an object, comprising:
    determining a characteristic comprising a loop resonance frequency associated with each of a plurality of electrically conductive loops arranged in an array;

for each loop of the plurality of loops, determining a parameter comprising a sum of a deviation of the characteristic associated with the loop from a reference value and a deviation of the characteristic associated with at least one adjacent loop from the reference value, wherein the parameter for at least two of the plurality of loops includes a deviation of the characteristic associated with the same adjacent loop; and determining the presence of the object based on the parameter.

10. The method of claim 9, wherein the characteristic further comprises a loop impedance.

11. The method of claim 9, wherein determining the parameter comprises applying a weighting factor to each of the deviations based on a geometrical arrangement of the plurality of loops.

12. The method of claim 9, wherein determining the parameter comprises compensating for a drift in the characteristic associated with each of the plurality of loops due to temperature by determining the parameter as a difference between the deviation of the characteristic associated with the loop from the reference value for the characteristic, and the deviation of the characteristic associated with the adjacent loop from the reference value.

13. The method of claim 12, wherein lead lines for the loop and for the adjacent loop are physically routed substantially together.

14. The method of claim 12, wherein compensating for the drift cancels out common drift in the characteristic associated with the loop and the adjacent loop.

15. The method of claim 9, wherein the plurality of loops do not overlap.

16. The method of claim 9, wherein the plurality of loops overlap.

17. An apparatus for detecting a presence of an object, comprising:
    means for determining a characteristic comprising a loop resonance frequency associated with each of a plurality of loops of a loop array;
    means for, for each loop of the plurality of loops, determining a parameter comprising a sum of a deviation of the characteristic associated with the loop from a reference value and a deviation of the characteristic associated with at least one adjacent loop from the reference value, wherein the parameter for at least two of the plurality of loops includes a deviation of the characteristic associated with the same adjacent loop; and
    means for determining the presence of the object based on the parameter.

18. The apparatus of claim 17, wherein the characteristic further comprises a loop impedance.

19. The apparatus of claim 17, further comprising means for compensating for a drift in the characteristic associated with each of the plurality of loops due to temperature by determining the parameter as a difference between the deviation of the characteristic associated with the loop from the reference value for the characteristic, and the deviation of the characteristic associated with the adjacent loop from the reference value.

20. The apparatus of claim 19, wherein compensating for the drift in the characteristic comprises cancelling out common drift in the characteristic associated with the loop and the adjacent loop.

21. The apparatus of claim 19, wherein the plurality of loops do not overlap.

22. A non-transitory computer-readable medium for detecting a presence of an object having encoded thereon instructions that when executed cause an apparatus to:
    determine a characteristic comprising a loop resonance frequency associated with each of a plurality of electrically conductive loops arranged in an array;
    for each loop of the plurality of loops, determine a parameter comprising a sum of a deviation of the characteristic associated with the loop from a reference value and a deviation of the characteristic associated with at least one adjacent loop from the reference value, wherein the parameter for at least two of the plurality of loops includes a deviation of the characteristic associated with the same adjacent loop; and
    determine the presence of the object based on the parameter.

23. The non-transitory computer-readable medium of claim 22, wherein the characteristic further comprises a loop impedance.

24. The non-transitory computer-readable medium of claim 22, wherein determining the parameter comprises compensating for a drift in the characteristic associated with each of the plurality of loops due to temperature by determining the parameter as a difference between the deviation of the characteristic associated with the loop from the reference value for the characteristic, and the deviation of the characteristic associated with the adjacent loop from the reference value.

25. The non-transitory computer-readable medium of claim 24, wherein compensating for the drift comprises cancelling out common drift in the characteristic associated with the loop and the adjacent loop.

26. The non-transitory computer-readable medium of claim 24, wherein the plurality of loops do not overlap.

* * * * *